US006954921B2

(12) United States Patent
Hassibi et al.

(10) Patent No.: US 6,954,921 B2
(45) Date of Patent: Oct. 11, 2005

(54) METHOD AND APPARATUS FOR AUTOMATIC ANALOG/MIXED SIGNAL SYSTEM DESIGN USING GEOMETRIC PROGRAMMING

(75) Inventors: Arash Hassibi, Mountain View, CA (US); Maria del Mar Hershenson, Los Altos, CA (US); David M. Colleran, San Mateo, CA (US)

(73) Assignee: Barcelona Design, Inc., Newark, CA (US)

( * ) Notice: Subject to any disclaimer, the term of this patent is extended or adjusted under 35 U.S.C. 154(b) by 105 days.

(21) Appl. No.: 10/118,672

(22) Filed: Apr. 7, 2002

(65) Prior Publication Data

US 2004/0172609 A1 Sep. 2, 2004

Related U.S. Application Data

(60) Provisional application No. 60/362,226, filed on Mar. 5, 2002.

(51) Int. Cl.$^7$ .............................. G06F 17/50
(52) U.S. Cl. ............................ 716/18; 716/2
(58) Field of Search ................... 716/1–3, 18

(56) References Cited

U.S. PATENT DOCUMENTS

| 4,827,428 | A | * | 5/1989 | Dunlop et al. ............. 716/6 |
| 5,055,716 | A | | 10/1991 | El Gamel |
| 5,289,021 | A | | 2/1994 | El Gamal |
| 5,633,807 | A | | 5/1997 | Fishburn et al. |
| 5,754,826 | A | | 5/1998 | Gamal et al. |
| 5,973,524 | A | | 10/1999 | Martin |
| 6,002,860 | A | | 12/1999 | Voinigescu et al. |
| 6,269,277 | B1 | * | 7/2001 | Hershenson et al. .......... 700/97 |
| 6,311,145 | B1 | | 10/2001 | Hershenson et al. |
| 6,311,315 | B1 | | 10/2001 | Tamaki |
| 6,381,563 | B1 | * | 4/2002 | O'Riordan et al. ........... 703/14 |
| 6,425,111 | B1 | | 7/2002 | del Mar Hershenson |
| 6,532,569 | B1 | * | 3/2003 | Christen et al. .............. 716/2 |
| 6,539,533 | B1 | | 3/2003 | Brown, III et al. |
| 6,574,786 | B1 | | 6/2003 | Pohlenz et al. |
| 6,577,992 | B1 | * | 6/2003 | Tcherniaev et al. .......... 703/14 |
| 6,578,179 | B2 | | 6/2003 | Shirotori et al. |
| 6,581,188 | B1 | | 6/2003 | Hosomi et al. |

FOREIGN PATENT DOCUMENTS

WO   WO 01/37429 A1   5/2001

OTHER PUBLICATIONS

Hershenson et al., "Optimal Design of a CMOS Op–Amp via Geometric Programming," IEEE Transactions on CAD of ICs and Systems, vol. 20, No. 1, Jan. 2001, pp. 1–21.*
Chan et al., "Analysis of Linear Networks and Systems," Addison–Wesley Publishing Company, 1972, pp. 23–25 and 46–47.

(Continued)

*Primary Examiner*—Leigh M. Garbowski
(74) *Attorney, Agent, or Firm*—Blakely, Sokoloff, Taylor & Zafman, LLP

(57) ABSTRACT

A method is described that involves recognizing that a variable within a monomial or posynomial expression for a characteristic of an analog or mixed signal system has a dependency on a lower level expression. Then, retrieving from a database the lower level expression and substituting it into the expression in place of the variable so as to describe the system at a greater level of detail than the variable did.

89 Claims, 23 Drawing Sheets

OTHER PUBLICATIONS

Hershenson, M., et al., "Optimization of Inductor Circutis via Geometric Programming", pp. 994–998, Design Automation Conference, Jun. 21, 1999, Proceddings.

Hershenson, M., et al., "Automated Design of Folded–Cascode Op–Amps with Sensitivity Analysis", pp. 121–124, Electeonics, Circuits and Systems, IEEE International Conference on LISBOA, Sep. 7–10, 1998.

Gielen, G., et al., "An Analogue Module Generator For Mixed Analogue/Digital ASIC Design", International Journal of Circuit Theory and Applications, vol. 23, pp. 269–283, 1995.

Kortanek, K.O., et al., "An Infeasible Interior–Point Algorithm For Solving Primal And Dual Geometric Programs," pp., 155–181, Mathematical Programming Society, Inc., 76:155–181, Jan. 1, 1995.

Von Kaenel et al., "A 320 MHz, 1.5 mW @ 1.35 V CMOS PLL for Microprocessor Clock Generation", IEEE Journal of Solid–State Circuits, vol. 31, No. 11, Nov. 1996, pp. 1715–1721.

Young et al., "A PLL Clock Generator with 5 to 110 MHz of Lock Range for Microprocessor", IEE Journal of Solid–State Circuits, vol. 27, No. 11, Nov. 1992, pp. 1599–1607.

Novof et al., "Fully Integrated CMOS Phase–Locked Loop with 15 to 240 MHz Locking Range and ±50 ps Jitter", IEEE Journal of Solid–State Circuits, vol. 30, No. 11, Nov. 1995, pp. 1259–1266.

Mohan et al., "Simple Accurate Expressions for Planar Spiral Inductances", IEEE Journal of Solid–State Circuits, vol. 34, No. 10, Oct. 1999, pp. 1419–1424.

Hershenson, "CMOS Analog Circuit Design Via Geometric Programming", A Dissertation submitted to the Department of Electrical Engineering and the Committee on Graduate Studies of Stanford University, Nov. 2003, 235 pages.

Hershenson, M., et al., "GPCAD: A Tool for CMOS Op–Amp Synthesis" 8 pages, Proceedings of the IEEE/ACM International Conference on Computer Aided Design (ICCAD), pp. 296–303, Nov. 1998.

Hershenson, M., et al., "Posynomial models for MOSFETs" 9 pages, Jul. 7, 1998.

Chang, H, et al., "A Top–Down, Constraint–Driven Design Methodology for Analog Integrated Circuits" 6 pages, IEEE 1992 Custom Integrated Circuits Conference.

Chavez, J., et al, "Analog Design Optimization: A Case Study" 3 pages, IEEE, Jan. 1993.

Geilen, G., et al., "Analog Circuits Design Optimization Based on Symbolic Simulation and Simulated Annealing", pp. 707–713, IEEE Journal of Solid–State Circuits, vol. 25, No. 3, Jun. 1990.

Fishburn, J, et al., "TILOS: A Posynomial Programming Approach to Transistor Sizing" pp. 326–328, IEEE, 1985.

Maulik, P., et al., "Integer Programming Based on Topology Selection of Cell–Level Analog Circuits", 12 pages, IEEE Transactions On Computer–Aided Design Of Integrated Circuits And Systems, vol. 14, No. 4, Apr. 1995.

Swings, K., et al., "An Intelligent Analog IC Design System Based On Manipulation Of Design Equations" pp. 8.6.1–8.6.4, IEEE 1990, Custom Integrated Circuits Conference.

Nesterov, Y., et al., "Interior–Point Polynomial algorithms in Convex Programming" 8 pgs., 1994, Society for Industrial and Applied mathematics.

Yang, H.Z., et al., "Simulated Annealing Algorithm with Multi–Molecule: an Approach to Analog Synthesis" pp. 571–575, IEEE, 1996.

Wong, D.F., et al., "Simulated Annealing For VLSI Design" 6 pages, 1998, Kulwer Academic Publishers.

Maulik, P., et al., "Sizing of Cell–Level Analog Circuits Using Constrained Optimization Techniques" pp. 233–241, IEEE Journal of Solid–State Circuits, vol. 28, No. 3, Mar. 1993.

Ochotta, E, et al., "Synthesis of High–Performance Analog Circuits in ASTRX/OBLS" pp. 273–295, IEEE Transactions on Computer–Aided Design of Integrated Circuits And Systems, vol. 15, No. 3, Mar. 1996.

Wright, S., "Primal–Dual Interior–Point Methods" pp. 1–3, http://www.siam.org/books/wright, Printed Aug. 19, 1998.

Shyu, J., et al., "Optimization–Based Transistor Sizing" pp. 400–408, IEEE Journal of Solid–State Circuits, vol. 23, No. 2, Apr. 1998.

Wright, S., "Primal–Dual Interior–Point Methods" 14 pages, 1997, Society for Industrial and Applied Mathematics.

Van Laarhoven, P.J.M., et al., "Simulated Annealing: Theory and Applications" 26 pages, 1987, Kulwer Academic Publishers.

Hershenson, M., et al., "CMOS Operational Amplifier Design and Optimization via Geometric Programming" pp. 1–4, Analog Integrated Circuits, Stanford University.

Aguirre, M.A., et al., "Analog Design Optimization by means of a Tabu Search Approach" pp. 375–378.

Medeiro, F., et al., "A Statistical Optimization–Based Approach for Automated Sizing of Analog Cells", pp. 594–597, Dept. of Analog Circuit Design.

Spatnekar, S., "Wire Sizing as a Convex Optimization Problem: Exploring the Area–Delay Tradeoff" 27 pages, Dept. of Electrical and Computer Engineering.

Su, H., et al., "Statistical Constrained Optimization of Analog MOS Circuits Using Empirical Performance Models" pp. 133–136.

Vassiliou, I., et al., "A Video Driver System Designed Using a Top–Down, Constraint–Driven Methodology" 6 pages.

Sapatnekar, S, et al., "An Exact Solution to the Transistor Sizing Problem for CMOS Circuits Using Convex Optimization" 35 pages.

* cited by examiner

200

201 {
- M1 = PMOS; GATE WIDTH = $W_1$; GATE LENGTH = $L_1$
- M2 = PMOS; GATE WIDTH = $W_2$; GATE LENGTH = $L_2$
- M3 = NMOS; GATE WIDTH = $W_3$; GATE LENGTH = $L_3$
- M4 = NMOS; GATE WIDTH = $W_4$; GATE LENGTH = $L_4$
- M5 = PMOS; GATE WIDTH = $W_5$; GATE LENGTH = $L_5$
- M6 = NMOS; GATE WIDTH = $W_6$; GATE LENGTH = $L_6$
- M7 = PMOS; GATE WIDTH = $W_7$; GATE LENGTH = $L_7$
- M8 = PMOS; GATE WIDTH = $W_8$; GATE LENGTH = $L_8$ $I_{BIAS}$ = I AMPS
$R_C$ = R OHMS
$C_C$ = C FARADS

202 {
- 1 = $V_{DD}$; M8$_{SOURCE}$; M5$_{SOURCE}$; M7$_{SOURCE}$
- 2 = M1$_{GATE}$
- 3 = M2$_{GATE}$
- 4 = $C_C$1; M6$_{DRAIN}$; M7$_{DRAIN}$
- 5 = M5$_{GATE}$; M7$_{GATE}$; M8$_{GATE}$; $I_{BIAS}$ 1
- 6 = M1$_{SOURCE}$; M2$_{SOURCE}$; M5$_{DRAIN}$
- 7 = M1$_{DRAIN}$; M3$_{DRAIN}$; M3$_{GATE}$; M4$_{GATE}$
- 8 = M2$_{DRAIN}$; $R_C$1; M4$_{DRAIN}$; M6$_{GATE}$
- 9 = $R_C$ 2; $C_C$ 2
- 10 = $V_{SS}$; $I_{BIAS}$ 2; M3$_{SOURCE}$; M4$_{SOURCE}$; M6$_{SOURCE}$

FIG. 2A

- SILICON SURFACE AREA CONSUMPTION = A cm$^2$
- POWER CONSUMPTION = B mW
- OPEN LOOP GAIN = C dB
- UNITY GAIN BANDWIDTH = D MH$_z$
- SLEW RATE = E V/$_{nsec}$

VOLTAGE_FOLLOWER
INTEGRATOR_1
INTEGRATOR_2
INTEGRATOR_3

1 = VOLTAGE_FOLLOWER.PWR; INTEGRATOR_1.PWR; INTEGRATOR_2.PWR; INTEGRATOR_3.PWR
2 = VOLTAGE_FOLLOWER.IN
3 = INTEGRATOR_3.OUT; INTEGRATOR_1.IN2; INTEGRATOR_2.IN2;
4 = VOLTAGE_FOLLOWER.OUT; INTEGRATOR_1.IN1
5 = INTEGRATOR_1.OUT; INTEGRATOR_2.IN1; INTEGRATOR_3.IN2;
6 = INTEGRATOR_2.OUT; INTEGRATOR_3.IN1
7 = VOLTAGE_FOLLOWER.IN_DISCHARGE; INTEGRATOR_1.IN_DISCHARGE; INTEGRATOR_2.IN_DISCHARGE; INTEGRATOR_3.IN_DISCHARGE
8 = VOLTAGE_FOLLOWER.IN_CHARGE; INTEGRATOR_1.IN_CHARGE; INTEGRATOR_2.IN_CHARGE; INTEGRATOR_3.IN_CHARGE
9 = VOLTAGE_FOLLOWER.GND; INTEGRATOR_1.GND; INTEGRATOR_2.GND; INTEGRATOR_3.GND;

FILTER.POWER = VOLTAGE_FOLLOWER.POWER + INTEGRATOR_1.POWER + INTEGRATOR_2.POWER
↑
612
$+ \left( \text{INPUT\_SCC.POWER} + \text{FEEDBACK\_SCC.POWER} + \text{OPAMP.POWER} + \dfrac{V_{DD}^2 \, [C_1 + C_2 + C_3]}{\tau} \right)$ FILTER.SURFACE_AREA = VOLTAGE_FOLLOWER.SURFACE_AREA + INTEGRATOR_1.SURFACE_AREA + INTEGRATOR_2.SURFACE_AREA
↑
613
$+ \left( \text{INPUT\_SCC.AREA} + \text{FEEDBACK\_SCC.AREA} + \text{OPAMP.AREA} + B\,[C + C_2 + C_3] \right)$ FILTER.DISCHARGING_SIGNAL.T > 20 $\tau_f$
↑
614
$\tau_f = C_f \left( \dfrac{7 C_i \left[ C_3 + \dfrac{\text{opamp.output\_capacitance}}{\text{opamp.input\_transconductance}} \right]}{\text{opamp.input\_transconductance}} + \dfrac{7 \left[ C_3 + \dfrac{\text{opamp.output\_capacitance}}{\text{opamp.input\_transconductance}} \right]}{\text{opamp.input\_transconductance}} + \dfrac{7 C_i}{\text{opamp.input\_transconductance}} \right)$ FILTER.CHARGING_SIGNAL.T >
↑
615
$\dfrac{7 (C_i + C_f)}{\text{opamp.unity\_gain\_bandwidth}} + \dfrac{2 V_{DD}}{\text{opamp.slew\_rate}}$

FIG. 6A

VOLTAGER_FOLLOWER
INTEGRATOR_1
INTEGRATOR_2
INPUT_SCC
FEEDBACK_SCC
OPAMP
$C_1$
$C_2$
$C_L$

1 = VOLTAGE_FOLLOWER.PWR; INTEGRATOR_1.PWR; INTEGRATOR_2.PWR; OPAMP.PWR
2 = VOLTAGE_FOLLOWER.IN
3 = INTEGRATOR_1.IN2; INTEGRATOR_2.IN2; OPAMP.OUT; FEEDBACK_SCC.1; $C_2$.1; $C_L$.1
4 = VOLTAGE_FOLLOWER.OUT; INTEGRATOR_1.IN1
5 = INTEGRATOR_1.OUT; INTEGRATOR_2.IN2; $C_1$.1
6 = INTEGRATOR_2.OUT; INPUT_SCC.1
7 = VOLTAGE_FOLLOWER.IN_DISCHARGE; INTEGRATOR_1.IN_DISCHARGE; INTEGRATOR_2.IN_DISCHARGE;
    INPUT_SCC.IN_DISCHARGE; FEEDBACK_SCC.IN_DISCHARGE
8 = VOLTAGE_FOLLOWER.IN_CHARGE; INTEGRATOR_1.IN_CHARGE; INTEGRATOR_2.IN_CHARGE;
    INPUT_SCC.IN_CHARGE; FEEDBACK_SCC.IN_CHARGE
9 = VOLTAGE_FOLLOWER.GND; INTEGRATOR_1.GND; INTEGRATOR_2.GND; INPUT_SCC.GND;
    FEEDBACK_SCC.GND; OPAMP.GND; $C_L$.2; OPAMP.IN+
10 = INPUT_SCC.2; FEEDBACK_SCC.2; OPAMP.IN-; $C_1$.2; $C_2$.2

712 → FILTER.POWER = VOLTAGE_FOLLOWER.POWER + INTEGRATOR_1.POWER + INTEGRATOR_2.POWER + $\frac{V_{DD}^2 C_4}{T} + \frac{V_{DD}^2 C_5}{T} + V_{DD}I_{BIAS} + V_{DD}I_{BIAS}L_8W_5/(W_8L_5) + V_{DD}I_{BIAS}L_8W_7/(W_8L_7) + \frac{V_{DD}^2[C_1+C_2+C_3]}{T}$ 713 → FILTER.SURFACE_AREA = VOLTAGE_FOLLOWER.SURFACE_AREA + INTEGRATOR_1.SURFACE_AREA + INTEGRATOR_2.SURFACE_AREA +

$\beta C_4 + \kappa[L_4W_4 + L_{10}W_{10} + L_{13}W_{13} + L_{14}W_{14}] + \beta C_5 + \kappa[L_{11}W_{11} + L_{12}W_{12} + L_{15}W_{15} + L_{16}W_{16}]$ $+ \beta C_C + \gamma R_C + \kappa[L_1W_1 + L_2W_2 + L_3W_3 + L_4W_4 + L_5W_5 + L_6W_6 + L_7W_7 + L_8W_8]$ 714 → FILTER_DISCHARGING_SIGNAL.T > $20k F W_{11}L_{11}[V_{DD}-V_T] C_2$ 715 → FILTER.CHARGING_SIGNAL.T > $7L_2C_i[C_3+Q[W_6L_6 + W_7L_7]]/(ZW_2C_F) + 7L_2[C_3+Q[W_6L_6 + N_7L_7]]/(ZW_2) + 7_GL_2/(ZW_2) +$
$7(C_i+C_f)L_6C_C/(ZW_6) + 4V_{DD}W_8L_1C_C/I_{BIAS}W_1$ 716 → $C_i = C_{101}P_1 + C_{402}P_2$ 717 → $C_f = C_{25}S$

VOLTAGE_FOLLOWER
INTEGRATOR_1
INTEGRATOR_2
M1 = PMOS; GATE WIDTH = $W_1$; GATE LENGTH = $L_1$
M2 = PMOS; GATE WIDTH = $W_2$; GATE LENGTH = $L_2$
M3 = NMOS; GATE WIDTH = $W_3$; GATE LENGTH = $L_3$
M4 = NMOS; GATE WIDTH = $W_4$; GATE LENGTH = $L_4$
M5 = PMOS; GATE WIDTH = $W_5$; GATE LENGTH = $L_5$
M6 = NMOS; GATE WIDTH = $W_6$; GATE LENGTH = $L_6$
M7 = PMOS; GATE WIDTH = $W_7$; GATE LENGTH = $L_7$
M8 = PMOS; GATE WIDTH = $W_8$; GATE LENGTH = $L_8$
M9 = NMOS; GATE WIDTH = $W_9$; GATE LENGTH = $L_9$
M10 = NMOS; GATE WIDTH = $W_{10}$; GATE LENGTH = $L_{10}$
M11 = NMOS; GATE WIDTH = $W_{11}$; GATE LENGTH = $L_{11}$
M12 = NMOS; GATE WIDTH = $W_{12}$; GATE LENGTH = $L_{12}$
M13 = NMOS; GATE WIDTH = $W_{13}$; GATE LENGTH = $L_{13}$
M14 = NMOS; GATE WIDTH = $W_{14}$; GATE LENGTH = $L_{14}$
M15 = NMOS; GATE WIDTH = $W_{15}$; GATE LENGTH = $L_{15}$
M16 = NMOS; GATE WIDTH = $W_{16}$; GATE LENGTH = $L_{16}$
$C_1 = C_1$ FARADS; $C_2 = C_2$ FARADS; $C_3 = C_3$ FARADS; $C_4 = C_4$ FARADS; $C_5 = C_5$ FARADS; $C_C = C_C$ FARADS
$R_C = R_C$ FARADS
$I_{BIAS}$ = I AMPS

FROM FIG. 7C

760

1 = VOLTAGE_FOLLOWER.PWR; INTEGRATOR_1.PWR; INTEGRATOR_2.PWR; M8SOURCE; M5SOURCE; M7SOURCE
2 = VOLTAGE_FOLLOWER.IN
3 = INTEGRATOR_1.IN2; INTEGRATOR_2.IN2; M7DRAIN; M6DRAIN; M16SOURCE; $C_2.1$; $C_3.1$; $C_C.1$
4 = VOLTAGE_FOLLOWER.OUT; INTEGRATOR_1.IN1
5 = INTEGRATOR_1.OUT; INTEGRATOR_2.IN2; $C_1.1$
6 = INTEGRATOR_2.OUT; M13SOURCE
7 = VOLTAGE_FOLLOWER.IN_DISCHARGE; INTEGRATOR_1.IN_DISCHARGE; INTEGRATOR_2.IN_DISCHARGE; M9GATE; M10GATE; M11GATE; M12GATE
8 = VOLTAGE_FOLLOWER.IN_CHARGE; INTEGRATOR_1.IN_CHARGE; INTEGRATOR_2.IN_CHARGE; M13GATE; M14GATE; M15GATE; M16GATE
9 = VOLTAGE_FOLLOWER.GND; INTEGRATOR_1.GND; INTEGRATOR_2.GND; M9SOURCE; M10SOURCE; M11SOURCE; M12SOURCE; M1GATE; M3SOURCE; M4SOURCE; M6SOURCE; M2GATE; $C_1.2$; $C_2.2$
10 = M14SOURCE; M15SOURCE; M2GATE; $C_1.2$; $C_2.2$
11 = M9DRAIN; M13DRAIN; $C_4.1$
12 = M10DRAIN; M14DRAIN; $C_4.2$
13 = M15DRAIN; M11DRAIN; $C_5.1$
14 = M12DRAIN; M14DRAIN; $C_5.2$
15 = M8DRAIN; $I_{BIAS.1}$
16 = M1DRAIN; M3DRAIN; M3GATE; M4GATE
17 = M2DRAIN; $R_C.1$; M4DRAIN; M6GATE
18 = $R_C.2$; $C_C.2$
19 = M5DRAIN; M1SOURCE; M2SOURCE
20 = M8GATE; M5GATE; M7GATE

CIRCUIT TOPOLOGY THREADING DIAGRAM

THREADING DIAGRAM FOR EQUATION SUBSTITUTIONS FOR INTEGRATOR AREA

METHOD AND APPARATUS FOR AUTOMATIC ANALOG/MIXED SIGNAL SYSTEM DESIGN USING GEOMETRIC PROGRAMMING

CROSS-REFERENCE TO RELATED APPLICATIONS

The present application is hereby cross-referenced to the following related applications:

U.S. patent application Ser. No. 10/119,347 filed on Apr. 7, 2002 entitled Automatic Phase Lock Loop Design Using Geometric Programming, by Dave Colleran and Arash Hassibi and U.S. patent application Ser. No. 10/810,444 filed on Mar. 26, 2004, entitled, Automatic Phase Lock Loop Desing Using Geometric Programming, by David M. Colleran and Arrash Hassibi.

This application claims the benefit of Provisional application Ser. No. 60/362,226 filed Mar. 5, 2002.

FIELD OF INVENTION

The field of invention relates generally to circuit design and more specifically, to a method and apparatus for automatic analog/mixed signal system design using geometric programming.

BACKGROUND 1.0 Automated Digital Circuit Design

As is well known in the art, digital electronic circuitry is often developed in an automated fashion by repeatedly compiling a design description into finer and finer levels of detail. FIG. 1 shows a perspective of a typical design methodology 100 for a digital circuit. At a highest level of detail (i.e., least amount of detail), referred to as the "behavioral" level of detail 101, a digital circuit design is described solely in behavioral terms. Better said, at the "behavioral level", the digital circuit to be developed is first described in terms of the methods it performs rather than in terms of the digital electronic circuitry that may be used to perform these methods.

As such, the specific format used to represent a digital circuit at the behavioral level 101 (e.g., a VHDL description or a Verilog description) is akin to a software program (e.g., with IF THEN, GOTO statements and the like) that describe, at a high level, methods that will be executed by the digital circuit. Typically, a circuit description at a particular level of detail is automatically brought to a next lower level of detail (i.e., more detailed) through a software process known as compiling. Compiling effectively converts a first file type into a second file type.

As such, with respect to a digital circuit design process, a particular level of circuit design detail is recorded according to a first file type (e.g., a behavioral level file type); and, the next lower level of detail is recorded according to a second file type. For example, a compiler may be used to compile a behavioral level of detail 101 description of a digital circuit to its next lower level of detail (the Register Transfer Level (RTL) 102). The RTL level 102 of detail effectively "blends" structural and methodological characteristics of the digital circuit within the same description.

For example referring to FIG. 1, note that the variable "A" that was originally described purely in abstract mathematical terms at the behavioral level 101, is re-described at the RTL level 102 as a 5 bit binary value. That is, the syntax A[4:0] observed at the RTL level 102 indicates that the variable "A" will eventually be implemented within the digital electronic circuit (that the RTL level 102 description describes) as five discrete wires (e.g., as part of a data bus); wherein, each wire will be capable of carrying its own voltage so as to indicate whether or not its value corresponds to a "1" or a "0".

Methods are still represented at the RTL level 102; and, as such, an RTL level 102 description is also akin to a software program. However, at various locations across an RTL level description, it is not unusual to find that certain high level methodologies originally described at the behavioral level 101 have been re-described as "logical" operations (e.g., SHFT, AND, OR, etc.). Although not necessarily a strict rule, RTL level 102 descriptions may be though of as a logical/binary "re-description" of the behavioral level 101 description; and, as such, the original functions specified by the designer at the behavioral level 101 are represented as a "digital" process at the RTL level 102.

An RTL level 102 description is usually compiled into a "gate level" 103 description. At the gate level 103, methods are largely (if not entirely) eliminated from the description of the digital circuit. The compiler used to produce the gate level 103 description (which may be referred to as a gate level netlist) effectively converts the logical operations of the RTL level description into specific logic circuits or "gates" (e.g., shift registers, AND gates, OR gates, XNOR gates, etc.). A depiction of a gate level circuitry is observed in FIG. 1.

Once a gate level netlist has been created, a transistor level 104 description (which, again, may be referred to as a netlist) of the circuit can be created (e.g., through a combination of compilation and timing analysis techniques). As logic gates are built with transistors, a transistor level 104 netlist is created by re-describing each logic gate in terms of its constituent transistors. Here, as transistors are the fundamental building blocks of an electronic circuit, the transistor level 104 netlist represents a lowest level of detail (or next to lowest level of detail if one considers layout information as being the lowest level of detail).

2.0 Lack of Widely Accepted Automated Analog and/or Mixed Signal Design Technology Digital signal processing, as alluded to above, "reacts" to an input signal depending on whether the input signal is recognized as a "1" or a "0". Likewise, digital signal processing generates an output signal from the perspective that the output signal corresponds to a "1" or a "0". Analog signal processing, by contrast, views an input signal as being continuous (rather than discrete "1"s or "0"s); and, on the output side, tailors a continuous output signal (as opposed to discrete "1"s or "0"s). When both analog and digital signal processing techniques are involved in the overall function of an electronic circuit, the electronic circuit may be referred to as a "mixed signal" circuit.

That is, mixed signal refers to the notion that both digital signal processing and analog signal processing are being performed with the same circuit. As such, mixed signal circuitry and analog circuitry are both configured to process analog signals (and, likewise, contain some degree of analog circuitry). Unfortunately, the design of analog and (at least the analog portion of) mixed signal circuit design has traditionally involved manual, hand crafted techniques rather than automated techniques. Here, the manual, hand crafted approach to analog and mixed signal circuit design tends to slow down or otherwise complicate the circuit design flow process.

With the semiconductor minimum feature sizes approaching 0.10 micron and below, highly integrated semiconductor chips are expected that will integrate significant amounts of both digital signal processing circuitry and analog signal processing circuitry onto the same semiconductor chip.

Furthermore, with the growth of networking and handheld applications, analog signal processing has observed a surge in interest (because communication and handheld circuits tend to depend more upon analog/mixed signal functionality than those used for desktop or raised floor computing system applications).

As such, analog and mixed signal circuit design techniques have received widespread attention recently because of the relative scarcity of analog circuit designers (in light of the increased demand for analog and mixed signal circuit designs themselves) combined with the manual, hand crafted approach to analog and mixed signal circuit design. Better said, the combination of manual design techniques, a small supply of analog designers and the increased demand for analog and mixed signal circuit designs has threatened the ability of analog/mixed signal circuit design teams to meet demand in a timely fashion.

FIGURES

The present invention is illustrated by way of example and not limitation in the figures of the accompanying drawings, in which like references indicate similar elements and in which:

FIG. 2a shows an embodiment of a transistor level netlist for an operational amplifier;

FIG. 2b shows a transistor level circuit topology for the operational amplifier described by the netlist of FIG. 2a;

FIG. 3a shows a description of an operational amplifier at the building block level of detail;

FIG. 5c shows a system level netlist for the system level circuit topology of FIG. 5b;

FIG. 6a shows the family of equations of FIG. 5a after substitutions were made in or to describe the third integrator of the $3^{rd}$ order switched capacitor filtering system at a greater level of detail;

FIG. 6b shows a circuit topology that corresponds to the enhanced level of detail at which the $3^{rd}$ integrator is described by the family of equations of FIG. 6a;

FIG. 6c shows a netlist that corresponds to the circuit topology of FIG. 6b;

FIG. 7a shows the family of equations of FIG. 6a having been substituted further so as to describe the $3^{rd}$ integrator at a transistor level of detail;

FIG. 7c shows a netlist the describes the $3^{rd}$ integrator at a transistor level of detail;

DETAILED DESCRIPTION

1.0 Introduction

Figure 1:
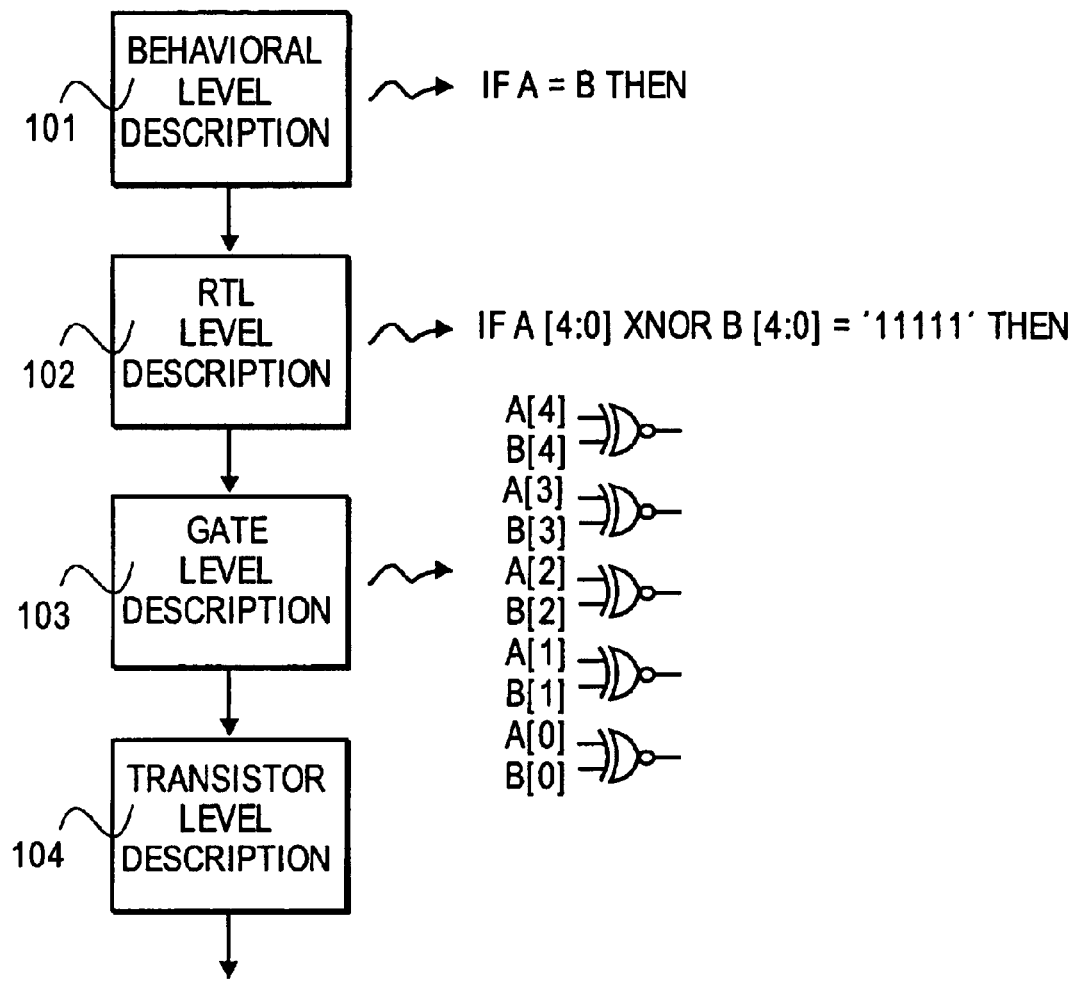
FIG. 1 shows an embodiment of an automated digital design process.

A solution to the problem of inefficient analog/mixed signal circuit design is to automate at least portions of the analog circuit design process. Here, the ability to describe electronic circuitry at various levels detail lends itself nicely to an automated circuit design process for a few reasons. Firstly, efficiency through automation is realized because a designer can adequately describe "that which needs to be built" (i.e., a circuit design) at a "high level" of detail. By allowing a designer to adequately describe a circuit at a high level of detail, the automated design process (rather than the designer) is left with the task of determining the more intricate details needed to prepare a circuit for manufacturing.

Here, the designer becomes more efficient because time that would have otherwise been devoted to determining the intricate details of a first design can be used, instead, to developing another high level description for a second design. Secondly, defining circuitry at various levels of detail makes the process flow of a software program that performs automated circuit design easier to define and construct. Better said, it is easier to develop a software program that is designed to automatically convert circuitry described at a first level of detail into circuitry described at a second level of detail (as opposed to an approach where various levels of detail are not appreciated).

The following description discussed various techniques for an automated analog circuit design process. Here, as both mixed signal and analog circuit design involves analog signal processing (and therefore analog circuit structures), the automated circuit design processes described below may be used to form analog as well as mixed signal circuits. For simplicity, the following is written largely "as if" only analog circuit design is applicable. However, it should be kept in mind that (as mixed signal can be viewed as analog circuitry combined with digital circuitry), the processes described below can be used to tackle mixed signal circuits as well.

Generally, with respect to an analog circuit design, completion of an automated circuit design process may be realized once a transistor level netlist has been formed. A transistor level netlist, as described in the background, is a listing of the nodes (i.e., "nets") in a circuit to be manufactured; and, for each node, a specification of each of the components that are connected to that node (e.g., a transistor gate, a transistor source, a transistor drain, a first electrode of a capacitor, a second electrode of a capacitor, a first electrode of a resistance, a second electrode of a resistance, etc.). Netlists may also list the components themselves that are part of the circuit design (e.g., transistors, resistors, capacitors).

For each identified transistor, the netlist also specifies relevant transistor dimensions. For example, with respect to circuit designs targeted for a Complementary Metal-Oxide-Semiconductor (CMOS) field effect transistor manufacturing process, a transistor level netlist should define the gate length and gate width of each transistor. An example of a transistor level netlist 200 for an 8 transistor operational amplifier ("op-amp" or "op amp" or "opamp") is observed in FIG. 2a. The corresponding transistor level circuit design 250 of the op-amp to which the netlist 200 of FIG. 2a pertains is observed in FIG. 2b.

Note that a listing of each of the transistors M1 through M8 is provided in field 201 of the netlist 200; and, a listing of each of nodes 1 through 10 is observed in field 202 of the netlist. Note also that, for each of the transistors specified in field 201 of the netlist 200, the gate length and gate width have been specified. Furthermore, as seen in the exemplary netlist 200 of FIG. 2a, note that other specifics are provided for such as specific resistance values and capacitance values (which may alternatively be described in terms of their dimensions), etc. It is important to point that the netlist 200 observed in FIG. 2a (as well as those presented throughout the application) is an exemplary embodiment. As such, other netlists may be readily created by those of ordinary skill having different organization and/or format than that observed in FIG. 2a.

Figure 2B:
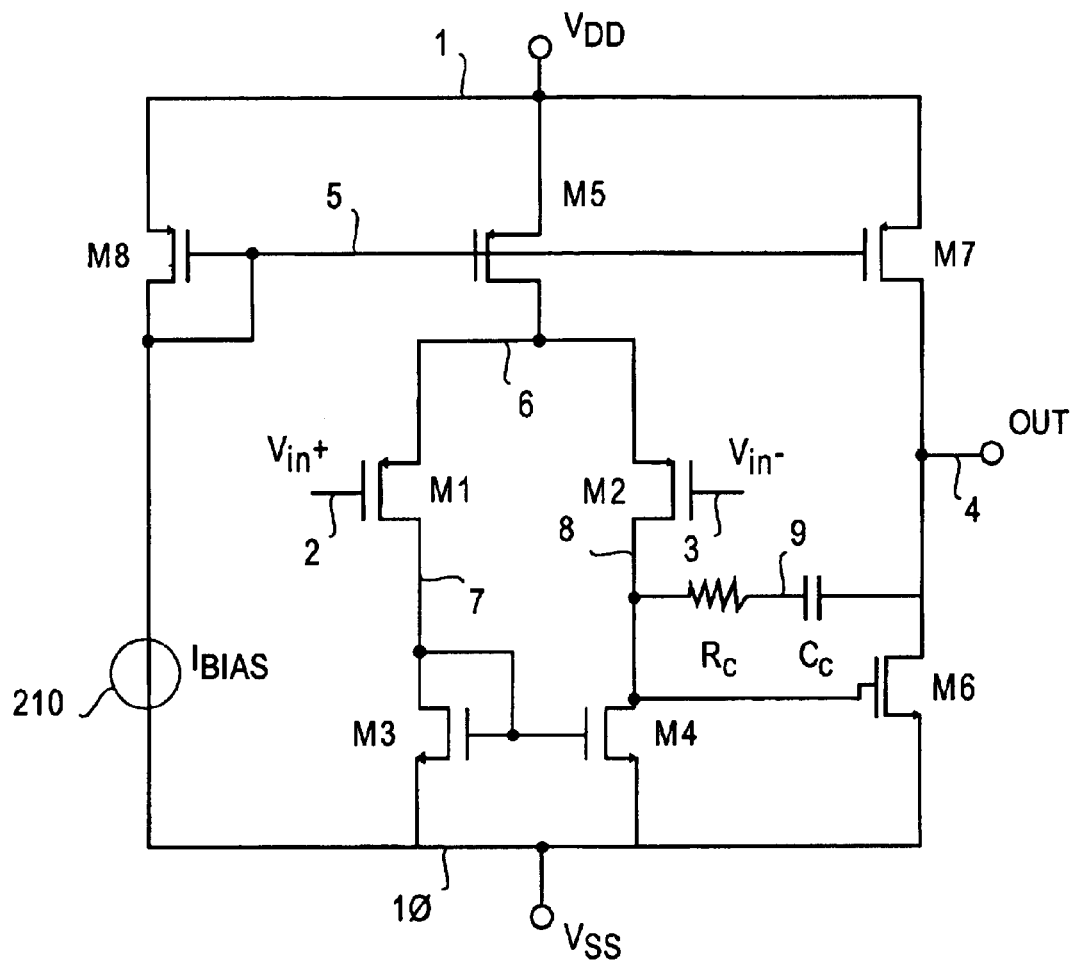

Heretofore, it has been appreciated that geometric programming can be used to rapidly define specific transistor dimensions (such as gate width and gate length) for a particular transistor level circuit design (such as the op-amp observed in FIG. 2b). For example, as described in U.S. Pat. No. 6,269,277 B1 entitled "System and Method for Designing Integrated Circuits" and issued on Jul. 31, 2001, specific transistor dimensions (as well as specific resistance and capacitance values) can be automatically determined for an operational amplifier based upon designer articulated functional characteristics of the operational amplifier.

For example, if a user desires the operational amplifier to have an open loop gain of CdB, a unity gain bandwidth of $DMH_z$, a slew rate of E V/nsec (to list just a few of the functional characteristics for an op amp), a software program may be used to mathematically relate the functional characteristics of the operational amplifier to specific transistor dimensions (and resistance and capacitance values) through "geometric programming". As such, some degree of automated analog circuit design has been heretofore recognized.

However to the extent that geometric mathematics have already been identified as an underlying approach to automated analog circuit design; up to now, a "hierarchical" geometric approach has not been described or recognized. Here, a hierarchical geometric approach (as described in Section 2.0, below) would allow specific transistor dimensions to be determined by "drilling down" through multiple levels of circuit description detail wherein each lower level adds more specific information about the circuit and wherein principles of geometric mathematics are preserved throughout each of the levels. Before describing such a system, a brief review of geometric programming will be provided so that the reader may understand relevant concepts relating to geometric programming.

2.0 Geometric Programming

Use of the term "geometric" in the present discussion refers to the use of equations that are expressed in monomial or posynomial form so that a geometric optimization problem can be constructed and/or solved in software. A monomial equation is an equation in the form of $$cx_1^{\alpha_1} x_2^{\alpha_2} \ldots x_n^{\alpha_n} \qquad \text{EQN. 1}$$

where $x_1\ x_2\ \ldots\ x_n$ are real, positive variables; $c \geq 0$; and, $\alpha_i$ is real. A posynomial equation is an equation in the form of $$\sum_{k=1}^{t} c_k x_1^{\alpha_{1k}} x_2^{\alpha_{2k}} \ldots x_n^{\alpha_{nk}} \qquad \text{EQN. 2}$$

where $x_1\ x_2\ \ldots\ x_n$ are real, positive variables; $c_k \geq 0$; and, $\alpha_i$ is real. An example of an equation expressed in monomial form is $2.3(x_1/x_2)^{1.5}$ (where $c=2.3$, $\alpha_1=1.5$, $\alpha_1=-1.5$); and, an example of an equation expressed in posynomial form is $0.7+2x_1/x_3^2+x_2^{0.3}$ (where $c_1=0.7$, $\alpha_{11}=\alpha_{21}=\alpha_{31}=0$; $c_2=2$, $\alpha_{12}=1$, $\alpha_{22}=0$, $\alpha_{32}=-2$; $c_3=1$, $\alpha_{13}=0$, $\alpha_{23}=1$, $\alpha_{23}=0.3$, $\alpha_{33}=0$).

Typically, a plurality of monomial and/or posynomial equations are collected or otherwise identified so that one of the equations can be "optimized" (e.g., maximized or minimized) so as to identify specific numeric values for the constituent variables associated with the equations used to construct and solve a geometric problem. For example, continuing with the example of the operational amplifier of FIGS. 2a and 2b, the power consumption, silicon surface area consumption, open loop gain, unity gain bandwidth, phase margin, and slew rate of the operational amplifier (as well as other functional characteristics of the operational amplifier) could each be described with a different monomial or posynomial equation.

As just one example of these, the open loop gain of the op amp could be expressed in monomial form as:

$$A_o = KI_{BIAS}(W_2 W_6 L_7 W_8 L_5 W_8/L_2 L_6 W_7 L_8 W_5 L_8)^{0.5} \qquad \text{EQN. 3}$$

where: 1) K is a constant obtainable by those or ordinary skill; 2) $I_{BIAS}$ is the current drawn by the current source 210 of the op amp of FIG. 2b; 3) W is the gate width of the transistor that the applicable subscript identifies; and; 4) L is the gate length of the transistor that the applicable subscript identifies. Here, other monomial or posynomial equations that each express a specific op amp characteristic (such as those listed in the preceding paragraph (as well as others)) in terms of variables that correspond to transistor gate dimensions (or other parameters that can be converted into specific transistor dimensions as described in more detail below) can be "collected" so that the collection of equations represents a family of equations that, together, describe (in monomial and/or posynomial form) the operational amplifier as a whole.

Once a group of appropriate monomial equations and/or posynomial equations are collected, specific numeric values (i.e., "constraints") may be specified for the particular functional characteristic that each of the equations describe. In a common approach, one of the equations is not provided a specific numeric constraint so that it can be optimized (in respect of the numeric constraints applied to the other equations) through a geometric solving process. That is, in this case, the geometric problem may be constructed according to the following definition:

Minimize monomial or posynomial equation_z     EQN. 4

Subject to:

constrained form of monomial equation_1 constrained form of monomial equation_2

⋮ constrained form of monomial equation_X

-continued

AND constrained form of posynomial equation_1 constrained form of posynomial equation_2

⋮ constrained form of posynomial equation_Y

Here, the "family" of posynomial and monomial equations used to describe the circuit (such as the op amp referred to above) include equation z (which may be from the group of monomial equations in the family or from the group of posynomial equations in the family). As such, there are X+Y+1 total equations in the family of equations; one of which is to be optimized, the remainder of which are constrained.

As an example, if specific numeric "target" values (or ranges) are articulated for each of the op amp characteristics other than silicon surface area consumption (e.g., power≦35 mW, open loop gain≧$10^6$; unity gain bandwidth≧100 MHz; phase margin≧60°; slew rate≧2.5 v/nsec), a geometric optimization problem can be constructed and solved wherein the solution corresponds to the minimum silicon surface consumption for the particular numeric constraints that were articulated. Better said, in the geometric problem model provided just above, the equation for silicon surface area consumption corresponds to "equation_z"; and, the remaining equations that describe the functional characteristics of the op amp correspond to the group of X+Y equations within the family that have been numerically constrained.

As such, if the equation for silicon surface area consumption is expressed in terms of specific transistor dimensions, the solution to the geometric problem (once the geometric problem is solved) will specify specific transistor dimensions that not only correspond to the minimum area of the op amp that may be achieved but also correspond to an op amp having the specific numeric constraints that were articulated. Before continuing, note that above cited geometric problem is just one type of geometric problem. For example, other geometric problems may choose to allow one or more equations (that take part in the problem solving process) to be unconstrained and neither maximized nor minimized. Generally, geometric problems are optimization problems that employ posynomial and/or monomial equations (that may be expressed in convex form or otherwise as explained in more detail below). The reader is referred to S. Boyd and L. Vandenberghe, "Introduction to Convex Optimization With Engineering Applications" Course Notes, 1999, http://www.leland.stanford.edu/class/ee364/. for more details regarding the various forms by which an optimization problem may be expressed in geometric form.

Regardless as to the specific form in which a geometric optimization problem is stated, note that the manner in which that form is obtained (e.g., the techniques or strategies used to develop a family of specific monomial and/or posynomial expressions) may be widely varied. For example, note that the $I_{BIAS}$ term that appeared above in the (monomial) expression for open loop gain (EQN. 3) may be further expressed in monomial or posynomial form in terms of the dimensions of its constituent transistors (which have been obviated from FIG. 2b for simplicity).

As such, such an expression for $I_{BIAS}$ could be: 1) directly substituted into EQN. 3 (so as to form an expression for open loop gain "completely" in terms of a constant and transistor dimensions); 2) "kept apart" as a separate equation that is included with the family of equations that take part in the geometric problem solving process (e.g., is one of the X+Y equations illustrated in EQN. 4); or, 3) "kept apart" as a separate equation that is not included with the family of equations that take part in the geometric problem solving process (e.g., is not one of the X+Y equations illustrated in EQN. 4).

In the former (first) case, the "variables" of the geometric optimization process (at least with respect to open loop gain) are limited to transistor dimensions as expressed in a single equation. In the middle (second) case, the "variables" of the geometric optimization process (at least with respect to open loop gain) are limited to transistor dimensions as expressed via a pair of equations (e.g., one for open loop gain and one for bias current). In the later (third) case, the "variables" of the geometric optimization process (at least with respect to open loop gain) include not only transistor dimensions but also the bias current $I_{BIAS}$ of the op amp current source.

In the later case, once an optimal value for $I_{BIAS}$ is obtained (e.g., as would naturally "fall out" as a result of a solution to a geometric problem where $I_{BIAS}$ was one of its variables), a separate following sequence (geometric or otherwise) could be used to determine specific transistor dimensions for those transistors used to construct the op amp current source 210. Thus, a complete description for the op amp could be obtained even if the posynomial and monomial equations that are used to construct a geometric problem are not expressed "solely" in terms of transistor dimensions. This feature may be taken advantage of, for example, in order to express performance characteristics in more traditional terms (e.g., where, in the case of op amps for example, important functional characteristics tend to be explained in terms of op amp bias current rather than the dimensions of the transistors that form the current source that provides the bias current).

The fact that the open loop gain of an op amp could be accounted for in a geometric programming environment by at least three different approaches has been mentioned above to bring to light some relevant properties regarding the application of geometric programming techniques to analog circuit design automation. Firstly, the specific organization as to which functional characteristics are expressed as a separate equation and/or which variables are chosen to take part in each equation (i.e., how each posynomial and monomial equation is particularly expressed) and/or which equations take part in a geometric problem solving sequence (and which equations simply "make use of" an optimization result) may vary from embodiment to embodiment.

As such, for any analog circuit design, an automated design tool may employ any of a vast number of different, mathematical "paths" or "threads" in order to achieve a specific end result (e.g., transistor gate dimensions for the transistors within the circuit). Here, the simple case of op amp open loop gain has illustrated three unique mathematical paths that could be used. As such, where specific mathematical equations (or specific sequence(s) of specific mathematical equations) have been presented in the present application (e.g., as an example of a process flow for an automated design tool), the claims that follow should not be automatically construed as being limited solely to these equations (or to the specific sequence(s) according to which they flow).

Secondly, a second property that was touched upon by the former (first) approach (by which open loop gain was expressed completely in terms of transistor dimensions by substituting an expression for $I_{BIAS}$ into EQN. 3) is that posynomial or monomial equations may be "substituted" into other posynomial or monomial equations such that the resultant equation preserves a posynomial or monomial form. For example, if the equation for $I_{BIAS}$ is expressed in monomial form, its substitution into EQN. 3 would cause the resultant expression for open loop gain to also be in monomial from (since EQN. 3 is expressed in monomial form). Similarly, the substation of a monomial expression into a variable of a posynomial expression allows the posynomial expression to remain in posynomial form; and, the substitution of a posynomial expression into a monomial expression causes the monomial expression to expand into a posynomial expression.

Before continuing to the next section, it is important to point out that (once a family of equations in monomial and/or posynomial form have been collected for a particular analog circuit) those of ordinary skill will be able to readily construct an appropriate geometric problem in software; and, furthermore create or use known methods to actually solve the geometric problem in software. For example, according to one type of approach referred to as the "convex" approach, logarithms of monomial and posynomial expressions (whose variables are expressed as exponentials) are used in order to convert the geometric optimization problem into convex form.

A convex optimization problem effectively optimizes a logarithmic function in light of a plurality of other, constrained logarithmic functions. Here, optimization problems expressed in convex form are numerically easier to compute for a digital computing system (e.g., a computer) that is tailored to solve the optimization problem (e.g., through the use of a software program). Accordingly, the term "geometric problem", "geometric optimization problem" and the like is meant to include geometric problems that have been formulated in convex form. Likewise, the term monomial is meant to include monomial equations that are in a format suitable for a convex optimization problem; and, the term posynomial is meant to include posynomial equations that are in a format suitable for a convex optimization problem. Typical software approaches used to solve convex optimization problems include interior-point primal barrier methods, interior-point primal-dual methods, and infeasible primal-dual methods among others. For these or other details related to geometric programming, the reader is again referred to http://www.leland.stanford.edu/class/ee364/.

3.0 Hierarchical Approach to Geometric Programming Based Automated Analog Circuit Design 3.1 Basic Analog Building Block Level of Detail Up to now, as alluded to above, known geometric problem solving techniques for automated analog circuit design have been limited to the transistor level. As such, geometric problem solving techniques for automated analog circuit design have been limited in application to defining transistor dimensions only for isolated, basic analog building blocks. A basic analog building block is an analog circuit (or mixed signal circuit) whose "next", lower level of detail (i.e., more specific level of detail) is a transistor level of detail when the analog circuit is not represented at a transistor level of detail.

Figure 3B:
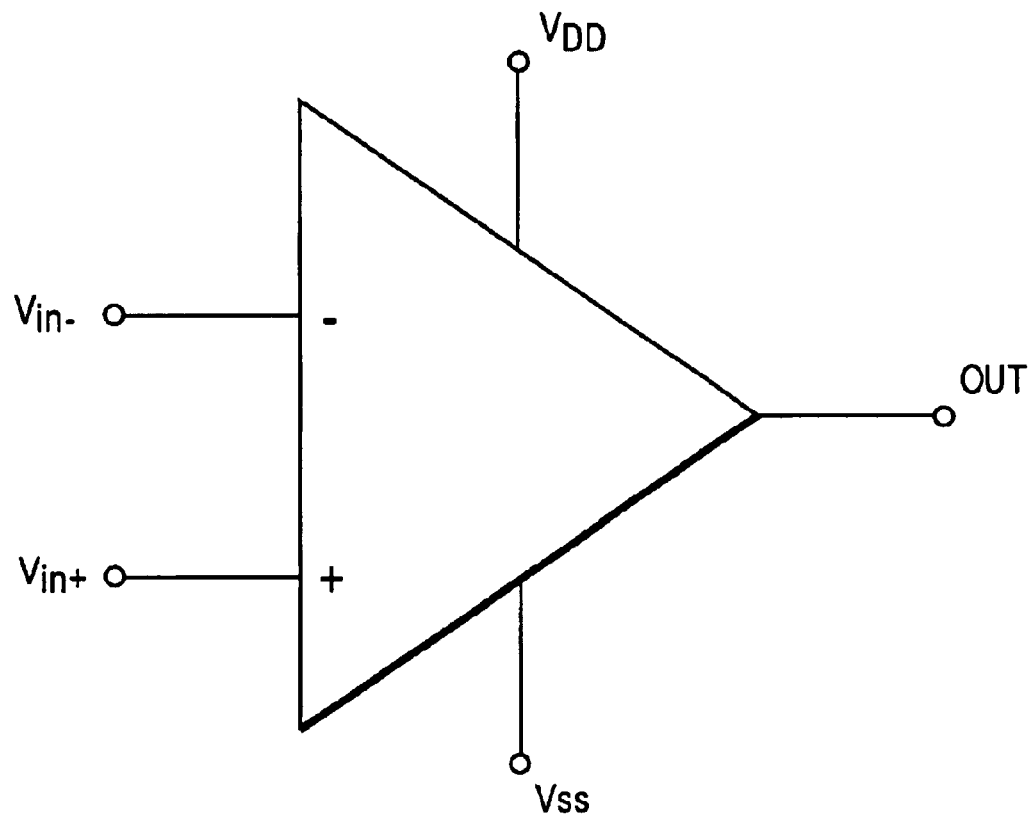
FIG. 3b shows a depiction of an operational amplifier at the building block level of detail.

An embodiment of basic, analog building block level of detail (or simply, "basic building block level of detail") for an operational amplifier is observed in FIGS. 3a and 3b. FIG. 3a shows an embodiment of a functional description articulated at the basic building block level of detail; and, FIG. 3b shows a circuit topology depiction for an opamp at the basic building block level of detail. Here, the opamp descriptions of FIGS. 2a and 2b may be compared with the opamp description of FIGS. 3a and 3b so as to form an understanding as to what is meant to by the term "basic analog building block" as described just above.

The operational amplifier depiction 350 of FIG. 3b is drawn as operational amplifiers are commonly drawn in a schematic drawing of a circuit that employs an operational amplifier. The characteristic description 300 of the operational amplifier 350 of FIG. 3b is observed in FIG. 3a. At the level of detail observed in FIG. 3b, with the exception of silicon surface area consumption, the description 300 of the operational amplifier 350 observed in FIG. 3a is limited to a listing of "functional" characteristics. Functional characteristics are electrical in nature rather than physical in nature. Thus, as seen in the example of FIG. 3a, the units of the characteristics listed therein are milliwatts (mW), decibels (dB), megahertz (MHz), degrees of phase, and Volts per nanosecond (V/nsec), etc.

Here, because the level of detail of the circuit topology 350 observed in FIG. 3b is devoid of transistor level information, the corresponding level of detail level to which the characteristics of the operational amplifier can be defined is correspondingly limited to levels of detail that are higher than the transistor level (such as the functional characteristics referred to above and observed in FIG. 3a). The next, lower level of detail to which the operational amplifier of FIGS. 3a and 3b can be described is the transistor level of detail observed in FIGS. 2a and 2b.

As discussed in the preceding section, the transistor level of detail includes transistor level information such as a circuit topology 250 that shows the individual transistors M1 through M8 used to construct the operational amplifier; and/or, a transistor level netlist 200 that not only describes the transistor level circuit topology 250 of FIG. 2b, but also includes specific dimensions for the transistors themselves. As such, whereas the level of detail associated with the description 300 of FIG. 3a describes the op amp largely in terms of its functional characteristics rather than its physical characteristics, note that the transistor level of detail describes the op amp largely in terms of its physical descriptions (e.g., specific nodes, their connections to particular transistor level components (such as resistors, capacitors and transistors) and the dimensions of these components) rather than its functional characteristics.

Because the next, lower level of detail of the description provided in FIGS. 3a and 3b is the transistor level (as observed in FIGS. 2a and 2b), the level of detail observed in FIGS. 3a and 3b correspond to a "basic analog building block". That is, because the next, higher level of detail above the transistor level of detail of FIGS. 2a and 2 is the level of detail observed in FIGS. 3a and 3b, the level of detail observed in FIGS. 3a and 3b is a "building block" level of detail. A number of widely recognized analog circuits other than operational amplifiers may also be considered as basic analog building blocks. These would include (among possible others): switched capacitor stage circuits, voltage controlled oscillators (VCOs), mixers, passive filters (noting that specific resistance and/or capacitive values may be described at the transistor level of detail), charge pumps, frequency-to-voltage converters, frequency dividers, frequency multipliers, phase detectors, etc.

Thus, to summarize, as is presently recognized in the prior art, geometric programming techniques have been used to automatically convert a description of an analog circuit at the basic building block level into a description at the transistor level of detail. Although this has commercial application, analog circuitry is often used, implemented and/or otherwise viewed at levels that are "higher" than the mere building block level. That is, entire analog "systems" are often constructed from a plurality of basic building blocks. An analog system is an analog circuit that couples together at least two or more basic analog building blocks in order to form at least part of a larger, analog circuit (the analog system) that can be viewed as a cooperative whole. Analog systems may also be constructed by coupling smaller analog systems together (and/or with other basic analog building blocks) in a cooperative fashion.

Some examples of analog systems would include, among others, phase-lock-loop (PLL) circuits and heterodyne receiver circuits. PLLs are constructed by coupling (in a "looped" signal processing channel): a phase detector, a charge pump, a filter, a voltage controlled oscillator (VCO) and a frequency divider. A heterodyne receiver is often formed by configuring a first filter, an amplifier, a mixer and a second filter along a signal processing channel. Here, from the descriptions provided just above, it is apparent that both the PLL and the heterodyne receiver each correspond to an analog system because each is constructed from a plurality of analog building blocks. As analog systems are most often formed with at least a plurality of analog building blocks, they may described with their own functional characteristics that represent the operation of the one or more analog building blocks as a functional whole.

For example, PLLs may be described according to their output signal frequency range, phase locking time, jitter, etc.; and, heterodyne receivers may be described according to their input frequency range, intermediate frequency range, sensitivity, etc. Note that, consistent with the concept of an analog system, these functional characteristics tend to describe properties of the overall "channel" that is formed by the coupling of various basic analog building blocks together (rather than describing the functional properties of a single building block by itself). As alluded to above, an even larger analog system can be constructed by coupling analog systems together in a cooperative fashion. For example, a "wireless receiver" analog system can be constructed by coupling a PLL system to a heterodyne receiver system (e.g., where the output of the voltage controlled oscillator of the PLL system is coupled to an input of the mixer within the heterodyne receiver system). Again, the "wireless receiver" can also have its own functional characteristics (e.g., channel reception range, etc.).

Given that a basic analog building block can now be distinguished from an analog system or a mixed signal system, the desire to extend geometric programming based automated design techniques (which so far have been limited to converting descriptions of analog building blocks into transistor level form) to entire analog or mixed signal systems is readily understandable. As such, the teachings herein relate to a design approach for a geometric programming based automated analog design tool that allows a designer to enter functional characteristics for an analog or mixed signal system so that the transistor level details of the analog or mixed signal system can be automatically determined (e.g., in response to specific constraints applied to system level characteristics as defined by an engineer).

3.2 Methodologies For Automatically Developing More Detailed Descriptions

Figure 4A:
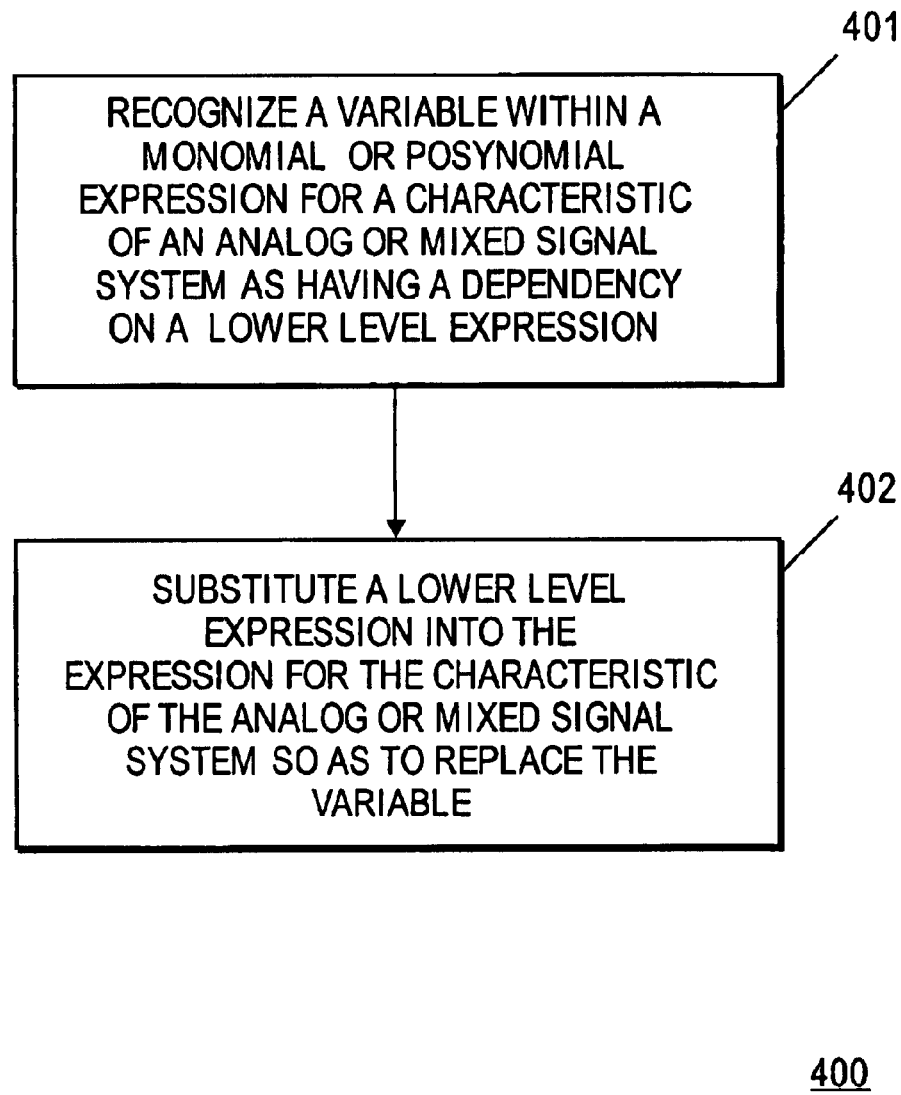
FIG. 4a shows a methodology for automatically developing a family of posynomial and/or monomial equations that describe a system at a greater level of detail than the system level of detail.

FIG. 4a shows a unit of operational flow 400 for an automated design tool as described just above. According to the basic unit of operational flow observed in FIG. 4a, a variable within a posynomial or monomial expression for a characteristic of an analog or mixed signal system (as opposed to an analog building block) is recognized 401 as having a dependency on a lower level expression. Here, the dependency may be recognized (for example) because the variable is not expressed in terms of transistor level details or is otherwise identified as having information described at a level that is higher than the transistor level.

The term "dependency" is used to invoke the notion that, in order for the variable to be represented at the transistor level, more detailed information needs to gathered (e.g., by "drilling down" through multiple levels of detail). Once an analog or mixed signal system level variable has been identified 401, a lower level monomial or posynomial expression for that variable is substituted 402 into the system level expression (so as to replace the "substituted for" variable within the system level expression). Substitutions may then be continually made until the original system level variable is expressed in transistor level terms.

Figure 4B:
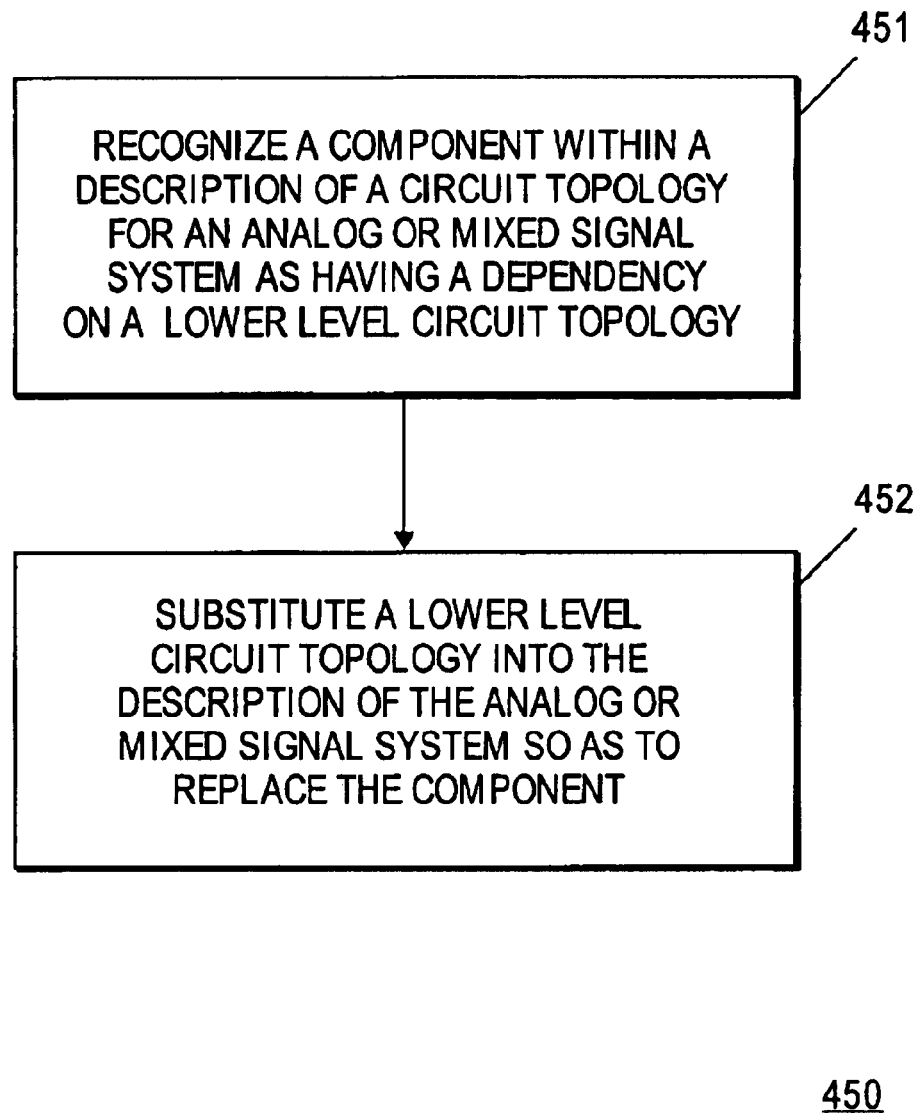
FIG. 4b shows a methodology for automatically developing a circuit topology that describes a system at a greater level of detail than the system level of detail.

FIG. 4b shows another unit of operational flow 450 for an automated design tool. A distinction between the methodology 400 of FIG. 4a and the methodology 450 of FIG. 4b is that the methodology 400 of FIG. 4a relates to the manipulation of posynomial and/or monomial equations; whereas, the methodology 450 of FIG. 4b relates to the manipulation of a netlist (or other circuit topology description) that describes the specific components and/or nodes of a circuit design. According to the basic unit of operational flow 450 observed in FIG. 4b, a component within the circuit topology of an analog or mixed signal system is recognized 451 as having a dependency on a lower level circuit component (e.g., a basic analog building block). Here, the dependency may be recognized (for example) because the circuit component is not expressed in terms of transistor level details or is otherwise identified as having information described at a level that is higher than the transistor level.

The term "dependency", again, is used in the above to invoke the notion that, in order for the component to be represented at the transistor level, more detailed information needs to gathered (e.g., by "drilling down" through multiple levels of detail). Once an analog or mixed signal system level component has been identified 451, a lower level circuit component is substituted 452 into the system level circuit topology (so as to replace the "substituted for" component within the system level topology). Substitutions may then be continually made until the original system level component is expressed in transistor level terms.

The methodologies 400, 450 of FIGS. 4a and 4b may be executed in series or in parallel, alone or in combination in order to help develop multiple "paths" or "threads" of circuit description detail so that, eventually, an analog or mixed system is thoroughly described at a transistor level of detail. As described further detail below, the various threads may "branch out" from a common thread section and/or exhibit longer thread lengths than other thread lengths (signifying a greater number of substitutions having to be made to reach the transistor level of detail). Note also that, according to various possible approaches, either methodology 401 alone (dependent variable recognition) or methodology 451 alone (dependent component recognition) may be used to trigger the execution of both methodologies 402 (equation substitution) and 452 (component substitution). This follows naturally when one views circuit topology and functional/physical description as part of a complete description (noting that at the transistor level topology and description may become merged as discussed with respect to FIG. 2a).

3.3 Embodiment of a System Level Description

Figure 5A:
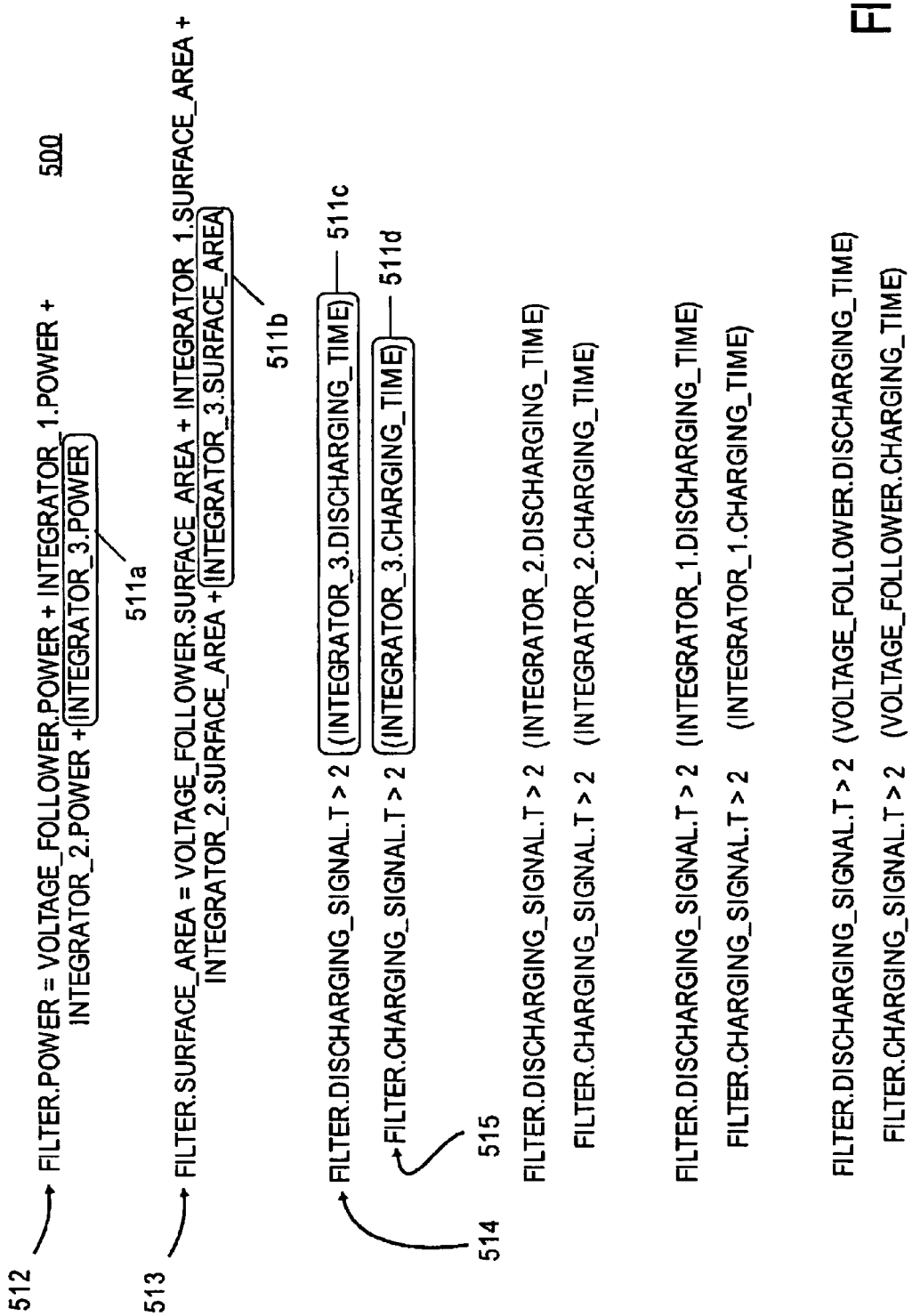
FIG. 5a shows a portion of a family of system level posynomial and monomial equations for a $3^{rd}$ order switched capacitor filter system.

FIGS. 5a through 7c relate to an exemplary embodiment as to how a system level variable/component for a 3rd order switched capacitor filter can be "drilled down" to a transistor level of detail by employing the methodologies 400, 450 of FIGS. 4a and 4b. Here, the effect(s) that the drilling down activity will have, in terms of enabling the automatic incorporation of more detailed information into the description of the circuit, will become more apparent. FIG. 5a shows a representation of a family 500 of posynomial and monomial equations that describe a 3rd order switched capacitor filter at the system level; and, FIG. 5b shows a circuit topology 550 for the 3rd order switched capacitor filter system that the family of equations 500 of FIG. 5a describe; and, FIG. 5c shows an embodiment of a netlist 560 that conforms to the circuit topology observed in FIG. 5b.

Figure 5B:
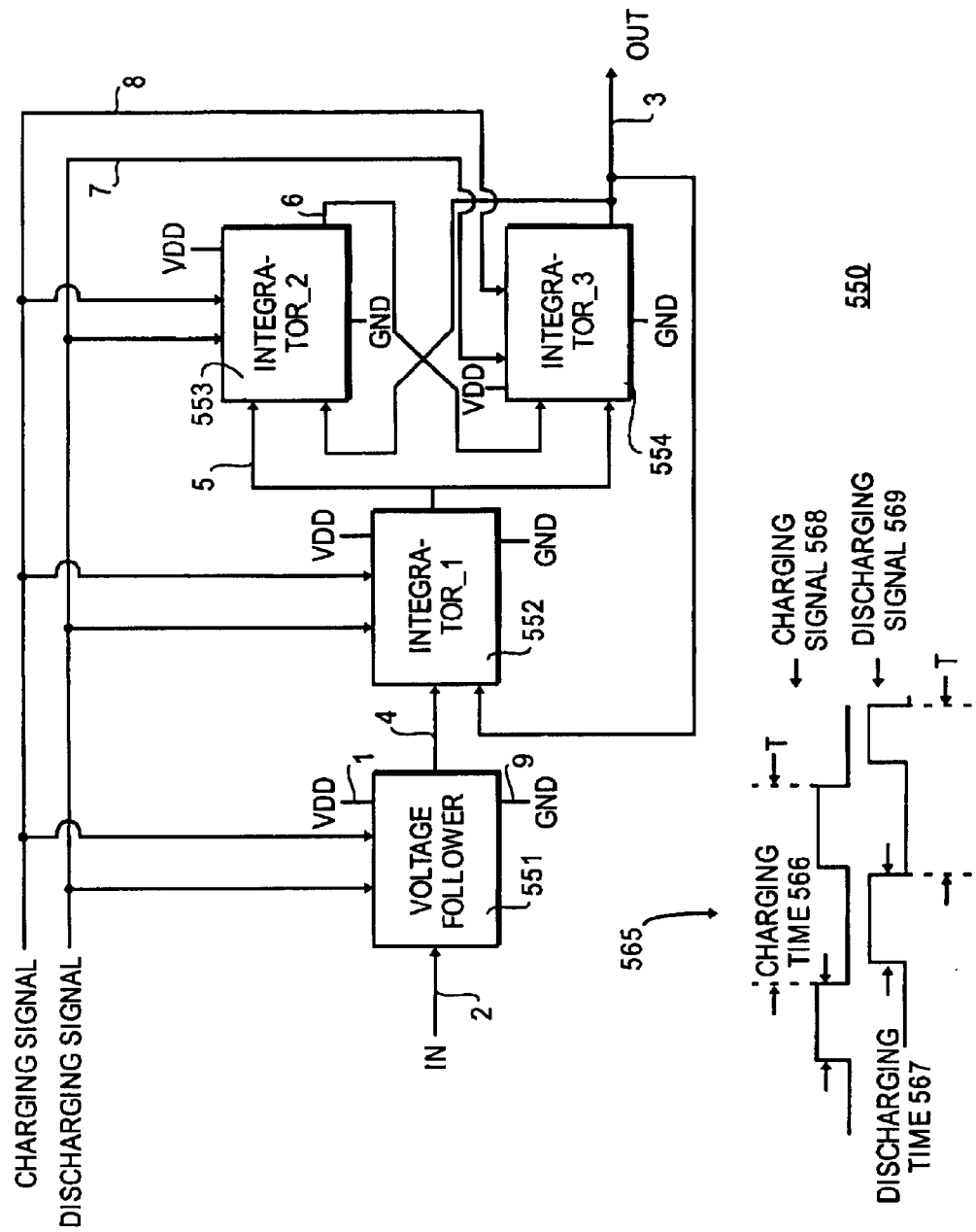
FIG. 5b shows a circuit topology for a $3^{rd}$ order switched capacitor filter system.

It is important to point out that the specific equations observed in FIG. 5a represent just a portion of the entire family of equations 500 that could be developed so as to thoroughly describe the switched capacitor filter system 550 of FIG. 5b. Regardless, the handful of equations observed in FIG. 5a will be sufficient to explain the operation of an automated analog/mixed signal design tool that is capable of converting a system level description to a transistor level description of a particular analog or mixed signal system.

Referring to FIG. 5b, note that the circuit topology 550 of the 3rd order switched capacitor filter system comprises a voltage follower 551 and three different integrators 552, 553, 554. Initially, an automated design tool may be tailored to configure (e.g., automatically or with the help of a designer) the system level circuit topology 550 of FIG. 5b (e.g., with a netlist such as that observed in FIG. 5c). Referring to either of FIGS. 5a, 5b, or 5c, note that transistor level information is devoid from the descriptions provided therein. Furthermore, as will be made apparent in the discussion that follows, integrator 554 represents a separate, lower level analog system of which the switched capacitor system 550 of FIGS. 5a through 5c is comprised.

This will be made apparent as one "drills down" through multiple levels of detail so as to create multiple threads of circuit level detail that extend from the high level, system representation of the switched capacitor circuit toward (finally) a transistor level description. In the discussion that immediately follows, the third integrator 554 will be drilled down to its transistor level of detail so that it is readily apparent how a transistor level description of a higher level analog system can be automatically generated. Specifically, the "integrator_3" variable 511a, 511b, 511c of each of the power consumption 512, silicon surface area consumption 513 and speed equations 514, 515 associated with the system level family of equations 500 will be expanded upon with multiple monomial and/or posynomial substitutions; and, the "integrator_3" circuit component 554 of the system level circuit topology of 550 of FIG. 5b (and its corresponding netlist) will also be continually expanded upon with corresponding circuit topology substitutions. The netlist 560 of FIG. 5c will grow in size as well to reflect the added detail to the circuit topology.

As such, the description that follows is written with an eye toward the methodologies 400, 450 observed in FIGS. 4a and 4b. Before continuing, however, a brief discussion regarding the design and operation of switched capacitor filters is in order. As observed in the circuit topology 550 of FIG. 5b, a 3rd order switched capacitor filter can be constructed with a voltage follower 551 "in front of" a trio of integrators 552, 553, 554. Here, note that the "order" of the filter is consistent with the number of integrators. Switched capacitor circuits, as will become more apparent below, operate by continuously and alternatively "discharging" and "charging" one or more capacitors.

Here, the activity of "discharging" and "charging" a capacitor causes the capacitor to "behave" as a precise resistor (which may be desirable in applications where the manufacturing tolerances of a discrete resistor do not meet the precision requirements of the analog system). As seen at the inset 565 of FIG. 5b, the capacitors are charged for a "charging_time" 566 that recurs at periodic intervals of T seconds; and, are discharged for a "discharging_time" 567 that recurs at periodic intervals of T seconds. A charging time signal 568 is applied at node 8 and a discharging time signal 569 is applied at node 7. The charging times and discharging times that are controlled by the discharging and charging signals 568, 569, respectively, are non overlapping with respect to one another so that each capacitor is repeatedly charged and discharged.

Observing the family of equations 500 of FIG. 5a that describe the characteristics of the 3rd order switched capacitor at the system level; note that the expressions for the power consumption 512 of the filter, the silicon surface area consumption 513 of the filter and the period of the discharging and charging signals (T) 513, 514 are expressed in a straight forward manner as filter.power=voltage_follower.power+integrator1.power+
    integrator2.*power*+*integrator3*.power            EQN. 5 filter.surface_area=voltage_follower.surface_area+
    integrator1.surface_area+integrator2.surface_area+
    integrator3.surface_area                           EQN. 6

$T>2$(integrator3.discharging_time)                    EQN.7A $T>2$(integrator3.charging_time)                       EQN.7B Here, note that EQNS. 5 and 6 are posynomial equations wherein each variable (e.g., voltage_follower.power, integrator1.power, etc.) is added in a straightforward manner (consistent with the mathematical definition provided in EQN 2) where c=1 for each term in the summation and α=1 for each term in the summation. Similarly, EQNS 7A and 7B are monomial expressions (consistent with the mathematical definition provided in EQN 1) with a single variable (e.g., integrator3.discharging_time) where c=2 and α=1.

Other equations for "T" are also observed in the family of equations 510 of FIG. 5a. Each of these additional equations effectively place further definition to the period "T" of the non-overlapping discharging and charging signals 568, 569 (i.e., in terms of the voltage follower 551 and each of the integrators 552, 553 other than integrator 3 554. These additional equations (in conjunction with EQNS 7A and 7B) effectively require that the charging time and discharging time of the switched capacitors associated with any of the components 551 through 554 of the filtering system 550 must be less than one half of the period "T" of the charging and discharging signals 568, 569.

Here, as the various components 551 through 554 may have different valued capacitances; each may need a different amount of time to charge and discharge its corresponding capacitance(s). As such, the group of equations for "T" will act together to effectively set the period T to be greater than twice that of the slowest charging time or discharging time amongst the group of components 551 through 554 in the overall filtering system 550. This may be viewed as a "design point" that the filtering system 500, 550 being described is designed according to.

Consistent with the methodologies 400, 450 observed in FIGS. 4a and 4b, respectively; the "dependence" of the overall system level description 500, 550 may be recognized (e.g., via execution of methodologies 401 and/or 451) so that it can be enhanced with substitutions of lower level details. Here, as an exercise, transistor level details will be retrieved for the third integrator 554 so that the dependence of the filter's power, surface area consumption and charging/discharging signal period T can be expressed (at least in relation to the third integrator 554) at a transistor level of detail.

Before continuing, however, it is important to understand that an automated design tool would be designed to not only bring the third integrator to its transistor level of detail; but also, each of the other components 551, 552, 553 as well. Such a design tool could "drill down" details for each of these components 551, 552, 553, 554 in parallel (i.e., each component is drilled down simultaneously) in series (i.e., once a first component is drilled down, a second component is drilled down) or some combination of both. Here, drilling down activity for only the integrator_3 component 554 is discussed for efficiency purposes.

Figure 6B:
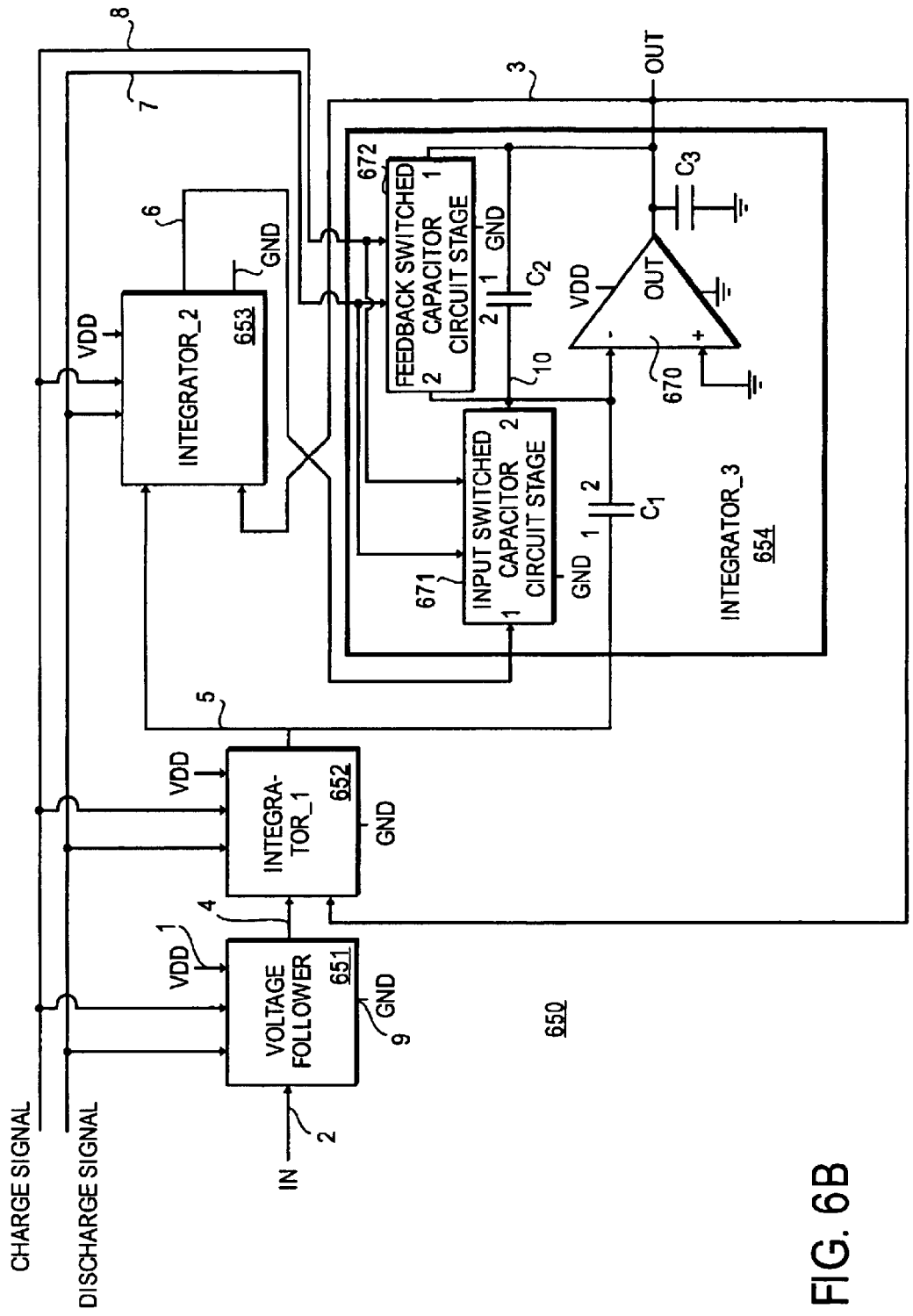

3.3 Embodiment of a Transition from A System Level Description to a Basic, Analog Building Block Level Description FIG. 6a shows the power consumption 512, silicon area surface consumption 513 and charging/discharging period T 514, 515 equations of FIG. 5a after they have been substituted (in accordance with process 402 of FIG. 4a) with new equations that describe each corresponding characteristic (e.g., power, surface area, T) at the next level of detail for the third integrator 554 (so as to form new, more detailed equations 612, 613, 614, 615). Note that the expressions relating to the voltage follower, integrator_1 and integrator_2 (that originally appeared in FIG. 5a) have been dropped from FIG. 6a for ease of drawing. FIG. 6b shows the circuit topology 650 after a corresponding substitution (in accordance with process 402 of FIG. 4a) is likewise performed; and, FIG. 6c shows the corresponding netlist 660.

Referring first to the new circuit topology information 654 for the third integrator, note that the third integrator 654 is further described as having an operational amplifier 670, an input switched capacitor circuit stage 671 and a feedback switched capacitor circuit stage 672 (as well as an input capacitor $C_1$, a feedback capacitor $C_2$ and an opamp load capacitor $C_3$). This new circuit topology information is substituted into the original system level netlist 560 of FIG. 5c (in accordance with the process 452 of FIG. 4b) so as to create the new, more detailed netlist 660 observed in FIG. 6c.

In an embodiment, the substitutions are made by making a "variable call" in software to a database that stores the desired variables (e.g., integrator3.power; integrator3.surface_area; integrator3.discharging_time; and integrator3.charging_time) along with their corresponding equations. Here, an "integrator" data file may be stored in the database that contains the circuit topology information (and corresponding monomial and posynomial equations). Thus, when the software calls for it (e.g., by name), the more detailed information that is desired is retrieved from the database.

Comparing FIGS. 5a and 6a, note that the new information that was substituted into EQNS 5,6,7A and 7B (which correspond to equations 512, 513, 514, and 515 of FIG. 5) respectively correspond to:

integrator3.power=input_scc.power+feedback_scc.power+opamp.power+$V_{DD}^2[C_1+C_2+C_3]/T$  EQN. 8 integrator3.surface_area=input_scc.area+feedback_scc.area+opamp.area+$\beta[C_1+C_2+C_3]$  EQN. 9 integrator3.discharging_time=$10.0\tau_{MAX}$=$10.0\tau_f$  EQN.10A integrator3.charging_time=  EQN. 10B $3.5C_i[C_3 + \text{opamp.output\_capacitance}]/$
$(C_f \text{opamp.input\_transconductance} +$
$3.5[C_3 + \text{opamp.output\_capacitance}]/$
opamp.input_transconductance+
$3.5C_i/$opamp.input_transconductance+
$3.5(C_i + C_f)/$opamp.unity_gain_bandwidth+
$V_{DD}/$opamp.slew_rate Note that nomenclature "scc" has been used to refer to a switched capacitor circuit stage. Here, each of EQNS 8, 9 and 10B are posynomial equations whose respective substitution into EQNS 5, 6 and 7B cause resultant equations 612, 613 to remain posynomial and causes resultant equation 615 to become posynomial (as made apparent in FIG. 6b). By contrast, EQN 10A is a monomial equation that allows resultant equation 614 to remain in monomial form.

With respect to EQN 8, the power consumption of the third integrator is broken down into the power consumption of each of its respective components 670, 671, 672, C1, C2 and C3 (noting that the dynamic power consumption of capacitors C1, C2 and C3 corresponds to the product of their summation with the supply voltage $V_{DD}$ squared and frequency (1/T)). Similarly, with respect to EQN 9, the surface area consumption of the third integrator is broken down into the surface area consumption of each of its respective components 670, 671, 672, C1, C2 and C3 (noting that surface area consumption of capacitors C1, C2 and C3 can be expressed in terms of their value and a manufacturing process dependent constant $\beta$). With respect to both EQNs 8 and 9, note that "transistor level" information appears in the form of capacitors C1, C2 and C3. However, as the integrator is still expressed in terms of basic building blocks 670, 671 and 672, these portions 670, 671, 672 of the level of detail to which the integrator depiction 654 of FIGS. 6a, 6b and 6c is being expressed are at the basic building block level of detail (rather than the transistor level of detail).

Focusing now on EQN 10A, it is worthwhile to note that switched capacitor circuits are often characterized in terms of a "time constant" $\tau$ that is a measure of how long it takes the capacitance associated with the switched capacitor circuit to discharge approximately 63% of its charge. Recalling that switched capacitor circuits are effectively used as precise resistors, a property of switched capacitor circuit stage is that in order for the desired, precise resistance to be realized, the capacitance of the capacitor circuit stage should ideally completely charge and discharge. As such, note that a constant of 10.0 is set for the discharging time of the capacitor. This effectively sets the formal "discharge time" of the switched capacitor circuit equal to 10 time constants which, in turn, means the filtering system is designed to recognize capacitor discharges (for the third integrator) that approach 100% discharge (e.g., 99.99% discharge) rather than 63% discharge. In practice, this serves as a form of "design margin" that is purposely designed into the switched capacitor circuit to ensure that its capacitor will be almost completely discharged before it is recharged.

The maximum time constant $\tau_{MAX}$ effectively corresponds to which of the switched capacitor circuits 671, 672 has the longer time constant (i.e., the higher effective resistance). Here, other functional characteristics of the filtering system or integrator (e.g., as might be expressed if FIG. 5a or 6a represented more complete descriptions) could be used to make this determination. For simplicity, this discussion assumes that the feedback switched capacitance circuit 672 has the longer time constant; and, as such, the notation $\tau_f$ is used. Finally, with respect to EQN 10B, note that the charging time of the integrator is related to various opamp related parameters (opamp.output_capacitance, opamp.input_transconductance, opamp.unity_gain_bandwidth, opamp.slew_rate the opamp input capacitance (Ci), the opamp feedback capacitance ($C_f$) and the opamp load capacitance $C_3$). Here, the faster the op amp 670 is able to swing its output voltage (in light of the various capacitances that are applied outside it), the faster the switched capacitor circuit stages 671, 672 will be able to charge their corresponding capacitors. As discussed in more detail below, the opamp input capacitance $C_i$ may be viewed as a combination of input capacitance $C_i$ and the capacitance associated with the input switched capacitor circuit stage 671; and the opamp feedback capacitance $C_f$ may be viewed as a combination of feedback capacitance $C_2$ and the capacitance associated with the feedback switched capacitor circuit stage 672.

Before continuing to the next level of detail, it is relevant to point out that the substitution that occurred in order to bring the description of FIGS. 5a, 5b and 5c to the description of FIGS. 6a, 6b and 6c effectively broke down the description of the third integrator into a plurality of basic analog building blocks (e.g., a pair of switched capacitor circuit stages 671, 672 and an op amp 670) and a few "transistor level" capacitances $C_1$ and $C_2$. Likewise, at least with respect to those threads of filter detail that flow through the switched capacitor circuit stages 671, 672 and op amp 670, the transition from the level of detail observed in FIGS. 5a, 5b, 5c to the level of detail observed in FIGS. 6a, 6b and 6c corresponds to a transition from a system level of detail to a basic building block level of detail.

Here, the methodologies of FIGS. 4a and 4b may be repeated wherein, the word "system" is replaced with the term "basic analog building block". When viewed in this manner, the substitutions 402, 452 associated with methodologies 4a and 4b will drop the switched capacitor circuitry and op amp portions of the third integrator description into the transistor level. This follows naturally when one considers that the next, lower level of detail for a basic analog building block is the transistor level of detail. Consistent then with the methodologies 400, 450 observed in FIGS. 4a and 4b (wherein the term "system" is viewed as being replaced by the term "basic analog building block"), respectively; the "dependence" of the building block level description for the opamp 670, the input switched capacitor circuit stage 671 and the feedback switched capacitor circuit stage 672 may be recognized (e.g., via execution of methodologies 401 and/or 451) so that each can be enhanced with substitutions of transistor level details.

Figure 7B:
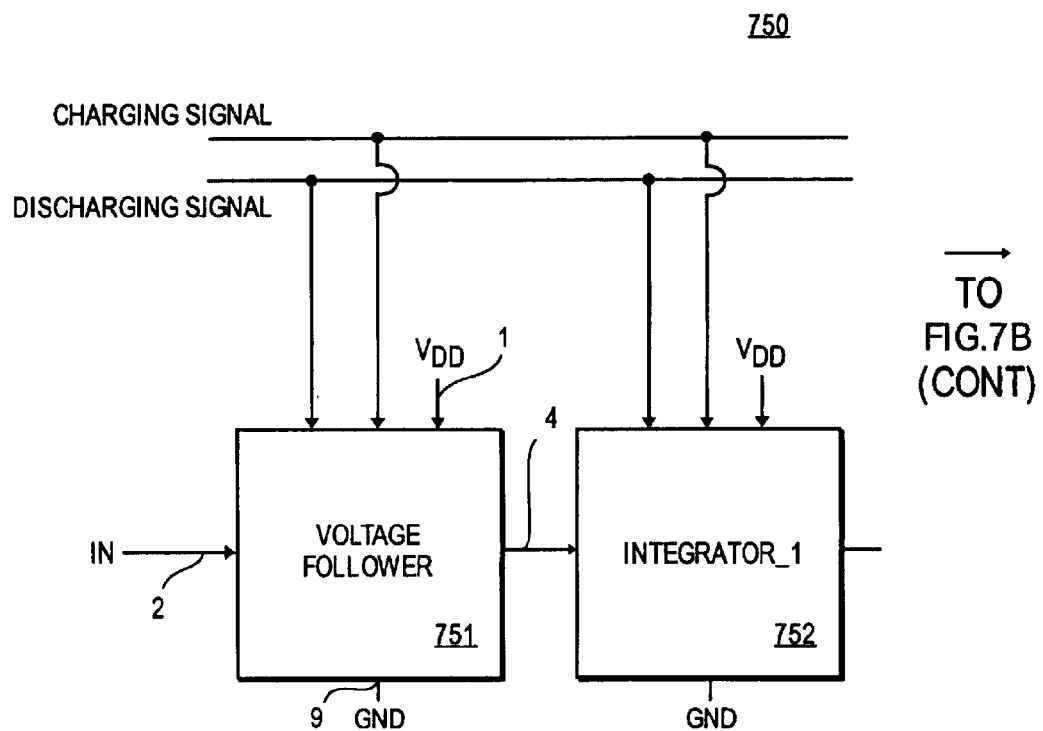
FIG. 7b shows a circuit topology at the transistor level of detail for the $3^{rd}$ integrator.
Figure 7B:
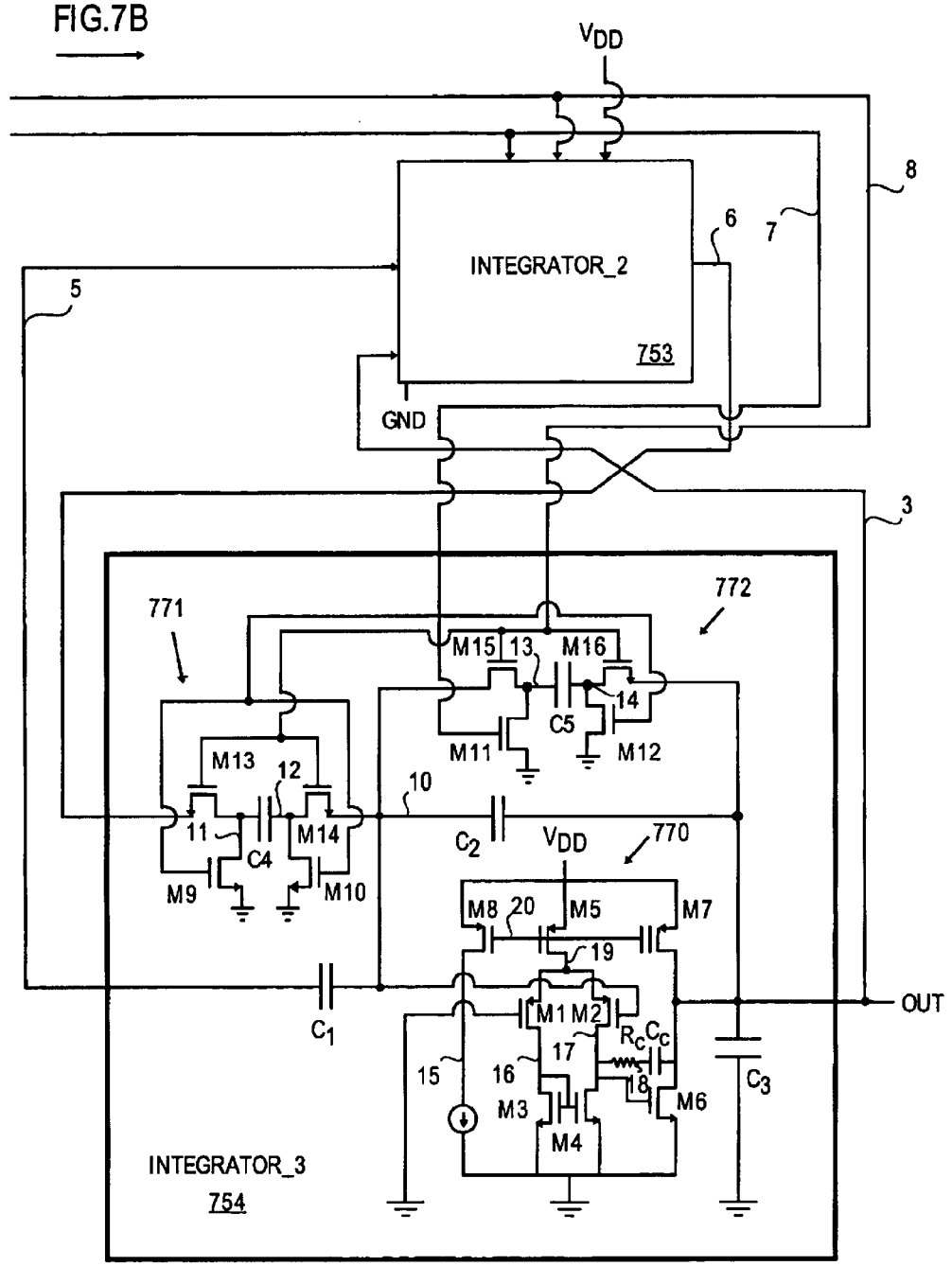

3.4 Embodiment of a Transition From a Basic, Analog Building Block Description to a Transistor Level Description FIG. 7a shows the power consumption 612, silicon area surface consumption 613 and charging/discharging period T 614, 615 equations of FIG. 6a after they have been substituted (in accordance with process 402 of FIG. 4a as modified as described just above) with new equations that describe each corresponding characteristic (e.g., power, surface area, T) at the next level of detail for the third integrator 654 (so as to form new, more detailed equations 712, 713, 714, 715). Similarly, FIG. 7b shows the circuit topology 750 after a corresponding substitution (in accordance with process 402 of FIG. 4a) is likewise performed; and, FIG. 7c shows an embodiment of the corresponding netlist 760.

Referring first to the new circuit topology information 754 for the third integrator (as observed in FIG. 7b), note that each of the switched capacitor circuit stages 771, 772 are further described as: 1) a capacitor (C4 in circuit 771 and C5 in circuit 772); 2) discharging transistors (M9 and M10 for circuit 771; and, M11 and M12 for circuit 772); and, 3) charging transistors (M13 and M14 for circuit 771; and, M15 and M16 for circuit 772). Furthermore, note that the op amp 770 has been described at the transistor level in a similar manner as that already described with respect to FIGS. 2a and 2b (e.g., with transistors M1 through M8). As such, the integrator is described in terms of 16 transistors M1 through M16.

The transistor level circuit topology information is substituted into the building block level circuit topology 650/netlist 660 of FIG. 6b/6c (in accordance with the process 452 of FIG. 4b) so as to create a new, more detailed circuit of the third integrator at the transistor level. Again, in an embodiment, the substitutions may be made by making a "variable call" in software to a database that stores the desired variables. Note that, in this case, at least two variable calls may have been made to the database (e.g., a first to retrieve a switched capacitor circuit data file having transistor level equations and circuit topology information for a switched capacitor circuit; and, a second to retrieve an opamp data file having transistor level equations and circuit topology information for an opamp).

Comparing FIGS. 6a and 7a, note that the new information that was substituted into EQNS 612, 613, 614, and 615 respectively correspond to:

| | |
|---|---|
| input_scc.power=$V_{DD}^2 C_4/T$ | EQN. 11 |
| feedback_scc.power=$V_{DD}^2 C_5/T$ | EQN. 12 |
| opamp.power=$V_{DD}I_{BIAS}+V_{DD}I_{BIAS}L_8 W_5/(W_8 L_5)+V_{DD}I_{BIAS}L_8 W_7/(W_8 L_7)$ | EQN. 13 |
| input_scc.area=$\beta C_4 + \kappa[L_9 W_9 + L_{10} W_{10} + L_{13} W_{13} + L_{14} W_{14}]$ | EQN. 14 |
| feedback_scc.area=$\beta C_5 + \kappa[L_{11} W_{11} + L_{12} W_{12} + L_{15} W_{15} + L_{16} W_-]$ | EQN. 15 |
| opamp.area=$\beta C_c + \gamma Rc + \kappa[L_1 W_1 + L_2 W_2 + L_3 W_3 + L_4 W_4 + L_5 W_5 + L_6 W_6 + L_7 W_7 + L_8 W_8] + I_{BIAS}$.area | EQN. 16 |
| $\tau_f = kFW_{11}L_{11}[V_{DD}-V_T]C_2$ | EQN. 17 |
| opamp.input_transconductance=$ZW_2/L_2$ | EQN. 18 |
| opamp.unity_gain_bandwidth=$ZW_6/(L_6 C_C)$ | EQN. 19 |
| opamp.slew_rate=$I_{BIAS}L_8 W_1(2W_8 L_1 C_C)$ | EQN. 20 |
| opamp.output_capacitance=$Q[W_6 L_6 + W_7 L_7]$ | EQN. 21 |

Note also that a pair of new equations 716, 717 have also been added to the family 710 of equations:

| | |
|---|---|
| $Ci = C_{1o1}P1 + C_{4o2}P2$ | EQN. 22 |
| $C_f = C_{25}S$ | EQN. 23 |

Referring to EQNS 11 through 23 above, and FIGS. 6a and 7a, note that each of EQNs 13, 14, 15, 16, and 22 are posynomial equations. As such, the substitution of EQN 13 into equation 612 allows the resultant equation 712 to retain its posynomial form; the substitution of EQNs 14, 15 and 16 into equation 613 allows the resultant equation 713 to retain its posynomial form. Furthermore, the addition of EQN 22 into the family of equations 710 allows it to be used for geometric programming purposes because its effective substitution into EQN 10B allows that equation to remain posynomial. Lastly, note that EQNs 11, 12, 17, 18, 19, 20, 21 and 23 are in monomial form (noting further that EQN.

17 is monomial because $V_{DD}-V_T$ is a constant). As each of equations 612 through 615 were posynomial at the previous level, the substitution of EQNs 11, 12, 18, 19 and 20 into equations 612 and 615 as appropriate merely adds another term in the family of posynomial equations. As such, equations 712 and 714 are posynomial at the transistor level. Similarly, the substitution of EQN 21 into EQN 10B and the effective substitution of EQN 23 into EQN 10B allows EQN 10B to remain posynomial.

With respect to EQNs 11 and 12, the power consumption of the switched capacitor circuits are expressed in terms of the dynamic power consumed by their corresponding capacitances. With respect to EQN 13, the op amp power is expressed in terms of the supply voltage and each of three current legs in the op amp (a first through M8, a second through M5 and a third through M7); where, each current in each leg is scaled relative to $I_{BIAS}$. Note that, similar to the discussion provided above with respect to FIGS. 2a and 2b, the transistor level description is expressed in terms of $I_{BIAS}$. Here, the $I_{BIAS}$ term may be recognized as a variable that is geometrically solved for; or, alternatively, further expressed in terms of its constituent transistors as a result of another transistor level detail enhancement (e.g., prior to any geometric problem solving).

With respect to EQNs 14, 15 and 16, the area of the switched capacitor circuits and the op amp are expressed as the summation of the area of their constituent transistors (and capacitors and/or resistors as applicable). Note that β, γ, κ are each process dependent constants that are obtainable by those of ordinary skill. With respect to equation 17, the term $kFW_{11}L_{11}[V_{DD}-V_T]$ corresponds to the effective "ON" resistance of one of the discharging transistors within the feedback switched capacitor circuit 772 (in particular transistor M11). As such, the "time constant" $\tau_f$ is expressed in the form of an "RC" time constant. Here, k is a process dependent constant that is obtainable by those of ordinary skill.

EQNs 17,18 and 19 relate their op amp characteristics to the dimensions of specific op amp transistor(s). EQN 18 further depends upon capacitance C3 and EQN 19 further depends upon Cc and $I_{BIAS}$. in the case of EQN 18). For each of EQNs 17, 18 and 19, Z is a process dependent constant obtainable by those of ordinary skill. EQN 21 expresses the output capacitance of the opamp as being the product of a constant Q and the summation of the areas of transistors $M_6$ and $M_7$. EQN 22 expresses the input capacitance in terms of the scaling constants P1, P2 respectively; where, P1 describes the scaling of capacitor C1 and the output capacitance of Integrator_1; and where, P2 describes the scaling of capacitor C4 and the output capacitance of Integrator_2.

Here, as the capacitances are scaled, their series capacitance (C1o1 and C4o2, respectively) are constants and P1 and P2 (the scaling factors) become variables in the family of equations that are solved for. Similarly, EQN 23 describes scaling between C2 and C5. Review of FIGS. 7a and 7b show the transistor level family of equations and circuit topology, respectively. As such, an embodiment for automatically developing a transistor level description of an integrator that is part of a larger 3rd order filtering system has been described. On a broader scale, one of ordinary skill will recognize that a strategy for automatically developing a transistor level detailed description of an entire analog system has been described.

Figure 8:
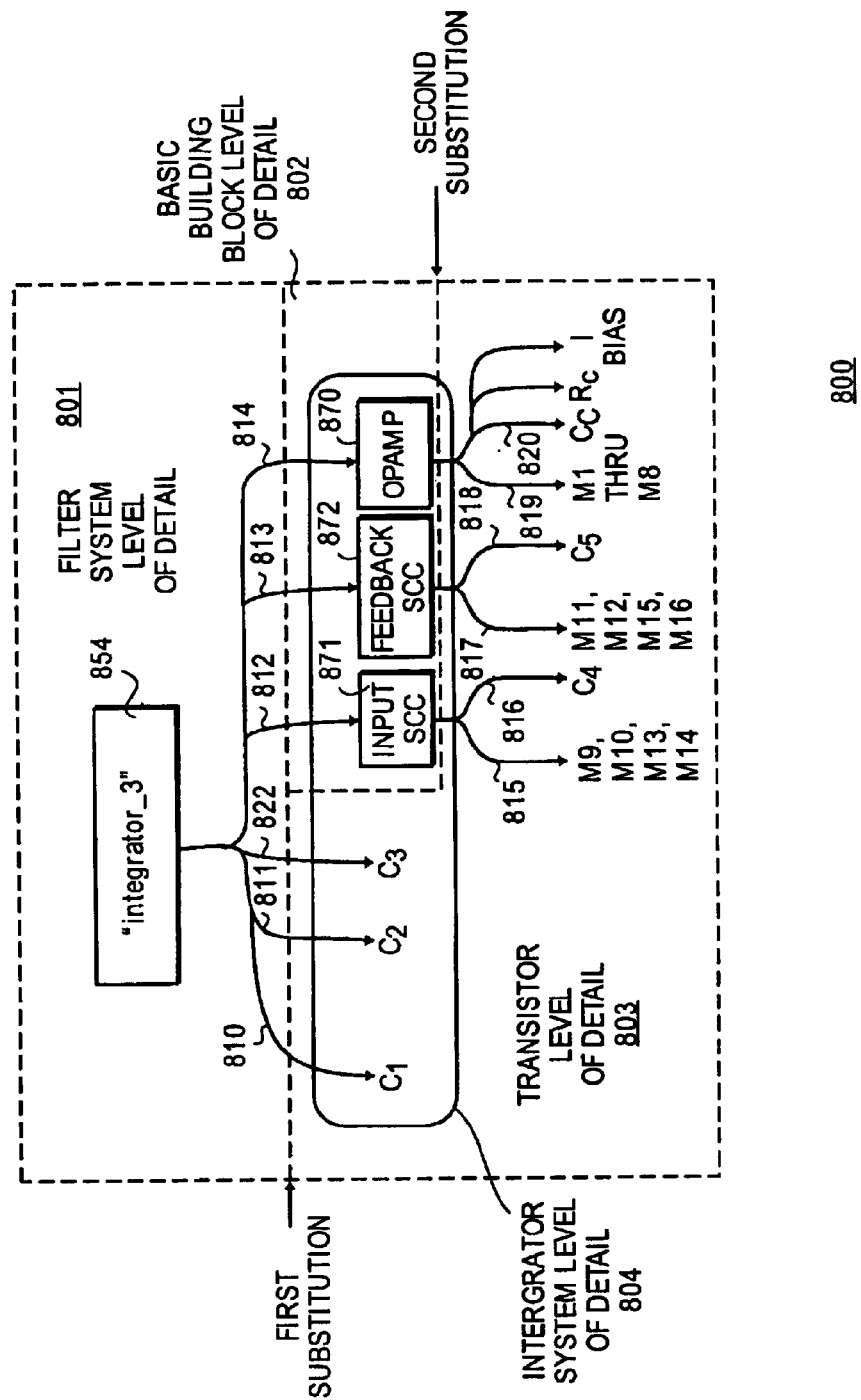
FIG. 8 shows a threading diagram for the circuit topologies referred to above with respect to FIGS. 5b, 6b and 7b.

4.0 Operation of Automated Analog Design Tool
4.1 Circuit Topology Threads and Equation Threads FIG. 8, which may be referred to as a "threading diagram", shows an example of the various circuit topology threads 800 that were formed for the third integrator 554 of the 3rd order filtering system 550 of FIG. 5b. Each thread section in the threading diagram 800 corresponds to a specific circuit topology detail that was substituted into a higher level circuit topology detail. For example, thread section 810 corresponds to the substitution of capacitor C1 into the description of the integrator topology 554, 854 that existed at the filter system level of detail 801; thread section 812 corresponds to the substitution of the input switched capacitor circuit 671, 871 into the description of the integrator topology 554, 854 that existed at the filter system level of detail 801; and, thread section 815 (which may also be viewed as a group of four unique thread sections) corresponds to the substitution of transistors M9,M10,M13, M14 into the description of the input switched capacitor circuit 671, 871 that existed at the basic analog building block level of detail 802.

From the depiction of FIG. 8, the various threads that were used to reach a particular level of detail can be easily articulated by piecing together the appropriate thread sections. That is, for example, thread section 811 corresponds to the thread used to reach C2; thread sections 813 and 817 correspond to the thread that was used to reach transistors M11, M12, M15, M16 (noting that thread section 817 can be viewed as a group of four unique thread sections); and thread sections 814, 819 correspond to the thread that was used to reach transistors M1 through M8 (noting that thread section 819 can be viewed as a group of 8 unique thread sections). Note that each thread traverses one or more levels of detail as determined by the particular circuit topology files that are "called upon" by the automated software design tool to make a substitution; and, the particular circuit or circuit region being automatically constructed.

As such, some threads depicted in FIG. 8 only traverse two levels of detail (e.g., system 801 and transistor level 803) whereas other threads traverse three levels of detail (e.g., system 801, basic building block 802, and transistor level 803). Generally, the more levels of detail a thread traverses, the longer the thread length (i.e., the more substitutions involved). Thus, different thread lengths may exist for different circuit elements that are part of an overall common circuit component (e.g., an integrator). For example, because the integrator was described as having input capacitance C1 at a level of detail just beneath the filter system level of detail 801 (and because explicit capacitance is sufficient to be deemed at the transistor level of detail), the thread used to reach C1 from the integrator topology 554, 854 that existed at the filter system level of detail 801 corresponds to just one thread section 810.

By contrast, because the integrator description just beneath the system level of detail 801 also described the integrator in terms of basic, analog building blocks 671, 871, 672, 872, 673, 873 the thread used to reach capacitor C4 corresponds to thread sections 812 and 815. Note that, unlike the thread used to reach C1, the thread used to reach C4 traverses the system level of description 801, the basic building block level of description 802 and the transistor level of description 803. Note that all of the threads reach the integrator system level of detail 804 which effectively corresponds to the fact that the integrator was described as a working system of op amp 870 and switched capacitor building blocks 871, 782 along with a trio of capacitances C1, C2, C3.

Figure 9:
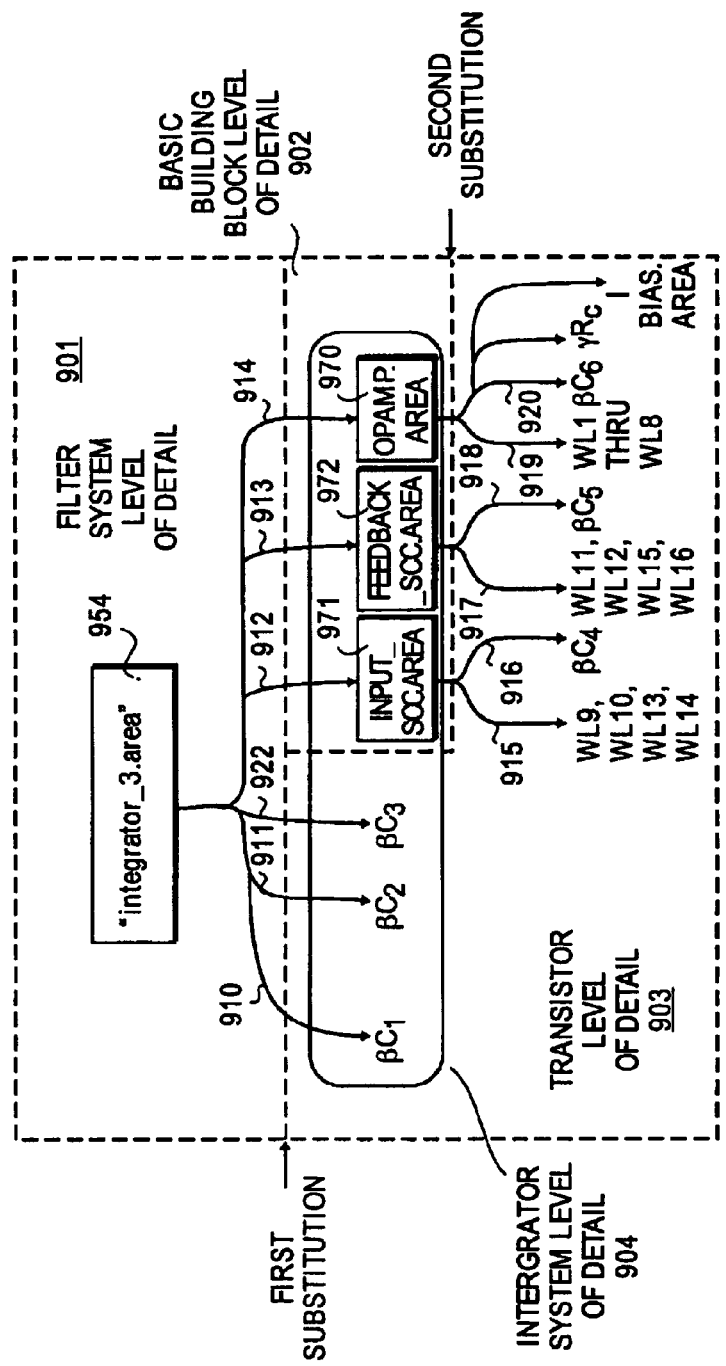
FIG. 9 shows a threading diagram that describes the substitutions that were made in order to develop a transistor level family of equations that describe the third integrator.

The threading properties described above apply not only to circuit topology descriptions but also to the family of equations that are developed for geometric problem solving. FIG. 9 shows a threading diagram 900 for the manner in which the transistor level posynomial expression for integrator surface are was reached. Note that, because area correlates closely to circuit topology, the threading diagram 900 of FIG. 9 is similar in structure to the threading diagram 800 of FIG. 8. Each thread section in the threading diagram 900 of FIG. 9 corresponds to a specific monomial or posynomial expression that was substituted into a higher level monomial or posynomial expression.

For example, thread section 910 corresponds to the substitution of the $\beta C1$ term (via EQN 9) into the expression 513, 954 for surface area consumption that existed at the filter system level of detail 901 (i.e., EQN. 6); and, thread section 915 corresponds to the substitution of EQN. 14 into the expression for the surface area consumption of input switched capacitor circuit 613, 971 that existed at the basic analog building block level of detail 902 (i.e., EQN. 9). Again, similar to the thread properties observed in FIG. 8, each thread traverses one or more levels of detail as determined by the particular monomial or posynomial expressions that are "called upon" by the automated software design tool to make a substitution; and, the particular circuit or circuit region being automatically constructed.

As such, some threads depicted in FIG. 9 only traverse two levels of detail (e.g., system 901 and transistor level 903) whereas other threads traverse three levels of detail (e.g., system 901, basic building block 902, and transistor level 903). Generally, the more levels of detail a thread traverses, the longer the thread length (i.e., the more substitutions involved). Thus, different thread lengths may exist for different terms in an expression that are part of an overall common circuit component (e.g., an integrator). For example, because the integrator surface area consumption was expressed (in EQN. 9) with the input capacitance area $\beta C1$ at a level of detail just beneath the filter system level of detail 901 (and because explicit capacitance is sufficient to be deemed at the transistor level of detail), the thread used to reach $\beta C1$ from the integrator expression for surface area consumption that existed at the filter system level of detail 901 (i.e., EQN 6) corresponds to just one thread section 910.

By contrast, because the integrator expression for surface area consumption just beneath the system level of detail (i.e., EQN. 6) also described the surface area consumption of the integrator in terms of the surface area consumption of basic, analog building blocks 671, 971, 672, 972, 673, 973 the thread used to reach $\beta C4$ corresponds to thread sections 912 and 916. Note that, unlike the thread used to reach $\beta C1$, the thread used to reach $\beta C4$ traverses the system level of description 901, the basic building block level of description 902 and the transistor level of description 903. Note that all of the threads reach the integrator system level of detail 904 which effectively corresponds to the fact that the integrator was described as a working system of op amp 970 and switched capacitor building blocks 971, 972 along with a trio of capacitances C1, C2, C3.

4.2 Overall Operation

Figure 10:
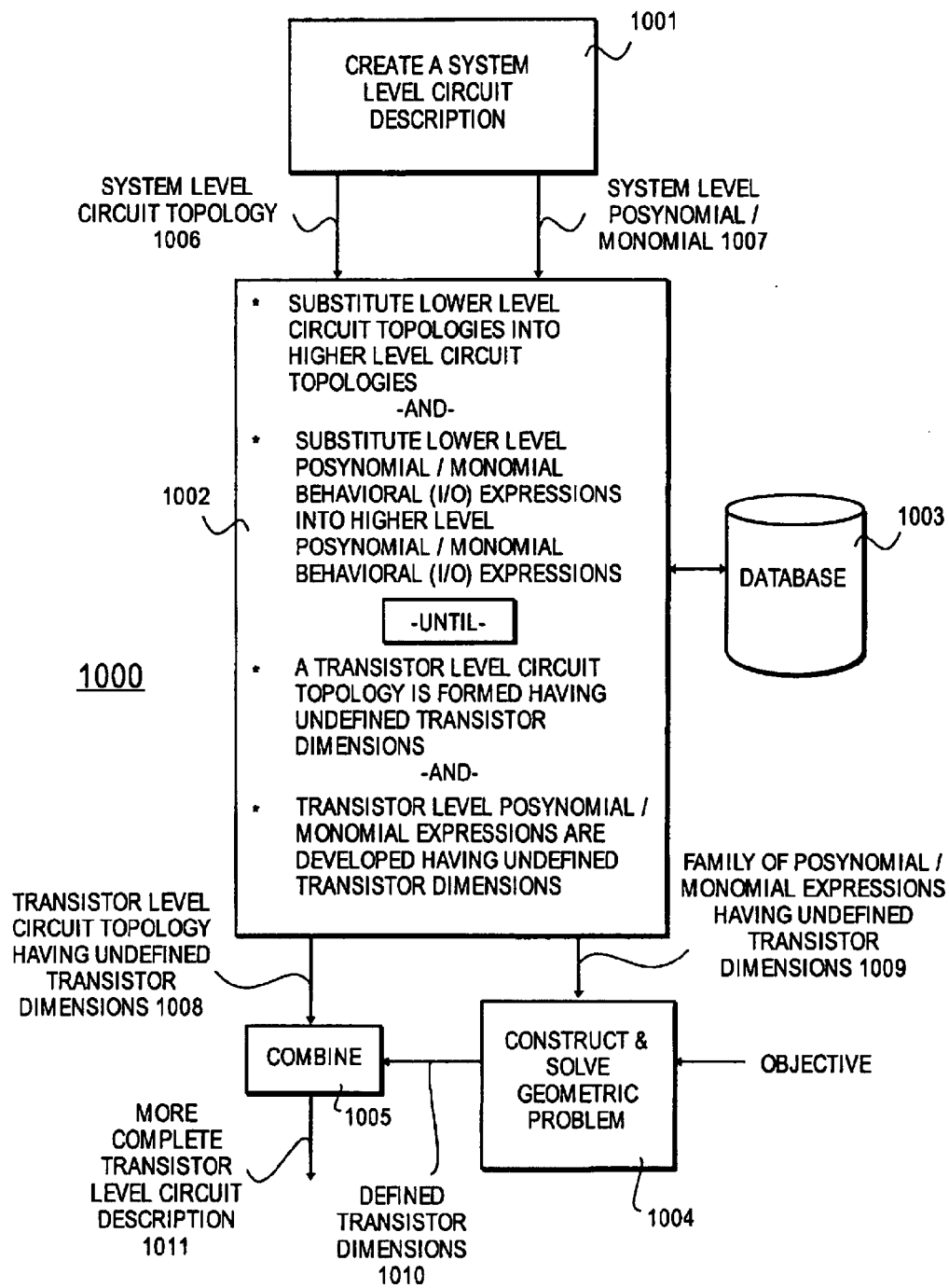
FIG. 10 shows a methodology for an automatic design tool system.

FIG. 10 shows an embodiment of a methodology 100 by which an automated design tool designed according to the principles expressed above may be configured to operate according to. Initially a system level description is created 1001. Recall that an example of a system level description was discussed with respect to FIGS. 5a through 5c. Here, the construction of a system level description results in system level topology information 1006 (e.g., netlist 560 of FIG. 5c) and system level monomial and/or posynomial equations 1007 (e.g., a portion of which were shown in FIG. 5a).

Once the system level description has been created 1001, lower level circuit topology information and monomial and posynomial expressions are substituted, respectively, into higher level circuit topology information and posynomial expressions until a transistor level circuit topology is formed having undefined transistor dimensions and transistor level posynomial expressions are developed having undefined transistor dimensions 1002. Embodiments of methodologies that may be used to perform the substations 1002 of FIG. 2 have been shown with respect to FIGS. 4a and 4b (and, where, the word "system" may be replaced with the phrase" "basic analog building block" in each of these figures). The software may make use of database 1003 that stores the information to be substituted into the higher level descriptions.

Once the transistor level has been reached, transistor level circuit topology information 1008 having undefined transistor dimensions results; and, a family of monomial and posynomial equations 1009 having undefined transistor dimensions is created. Then, a geometric problem is constructed and solved 1004 which provides numeric details 1010 that define the previously undefined transistor dimensions. A particular objective (such as minimizing a particular characteristic such as power consumption or surface are consumption) is usually articulated when constructing the geometric problem. Then, the defined transistor dimensions 1010 are combined 1005 with the transistor level circuit topology information (having undefined transistor level dimensions) so as to form a more complete transistor level description 1011 of the circuit.

Figure 11:
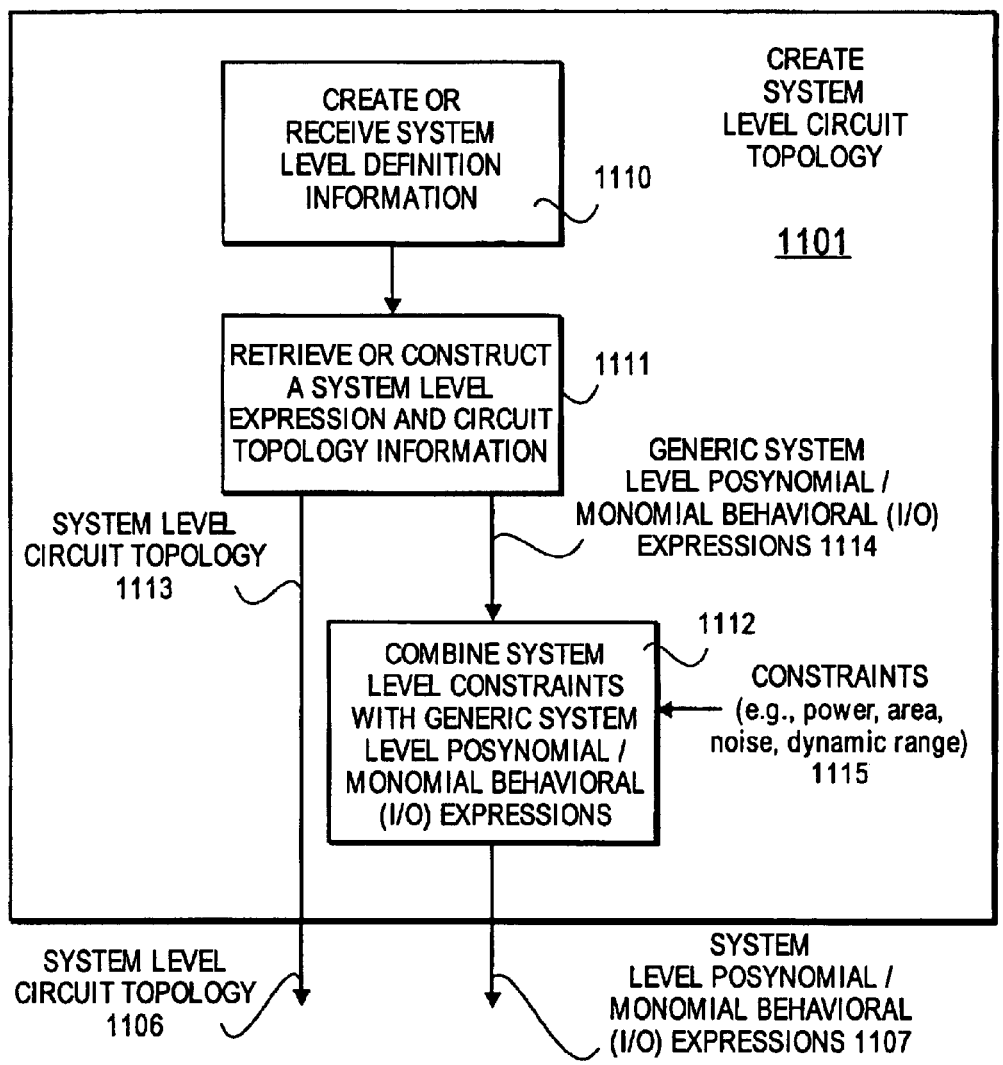
FIG. 11 shows a methodology for creating a system level description.

FIG. 11 shows an embodiment as to how the system level description of the circuit may be formed 1001. According to the approach of FIG. 11, definitional information of a system is created or received or otherwise provided 1110. Here, definitional information effectively defines the "type" of circuit or system to be constructed (e.g., filter or switched capacitor filter or heterodyne receiver). The degree of detail provided at system definition may vary from embodiment to embodiment (e.g., 3rd order switched capacitor filter). In various embodiments, a circuit designer enters this information into the software tool.

Then, system level circuit topology information and system level monomial and/or posynomial expressions are retrieved or constructed 1111. This may be done by the designer, by the software automatically (e.g., by receiving a generic data file from the database for the system type specified by the designer) or some combination of both. This produces a system level circuit topology 1106 (e.g., a system level netlist) and a system level family of monomial and/or posynomial expressions that are left unconstrained (e.g., without specific numeric constraints). Then, constraints 1115 are applied 1112 to the family of unconstrained equations 1114 (e.g., a specific number for "bandwidth" and/or "power consumption" and "charging period T"). So as to update the family of equations with the desired constraints. Note that each and every equation in the family of equations need not receive a specific constraint (indicating the designer is allowing the particular characteristic to vary at will with the geometric problem solving process).

Figure 12:
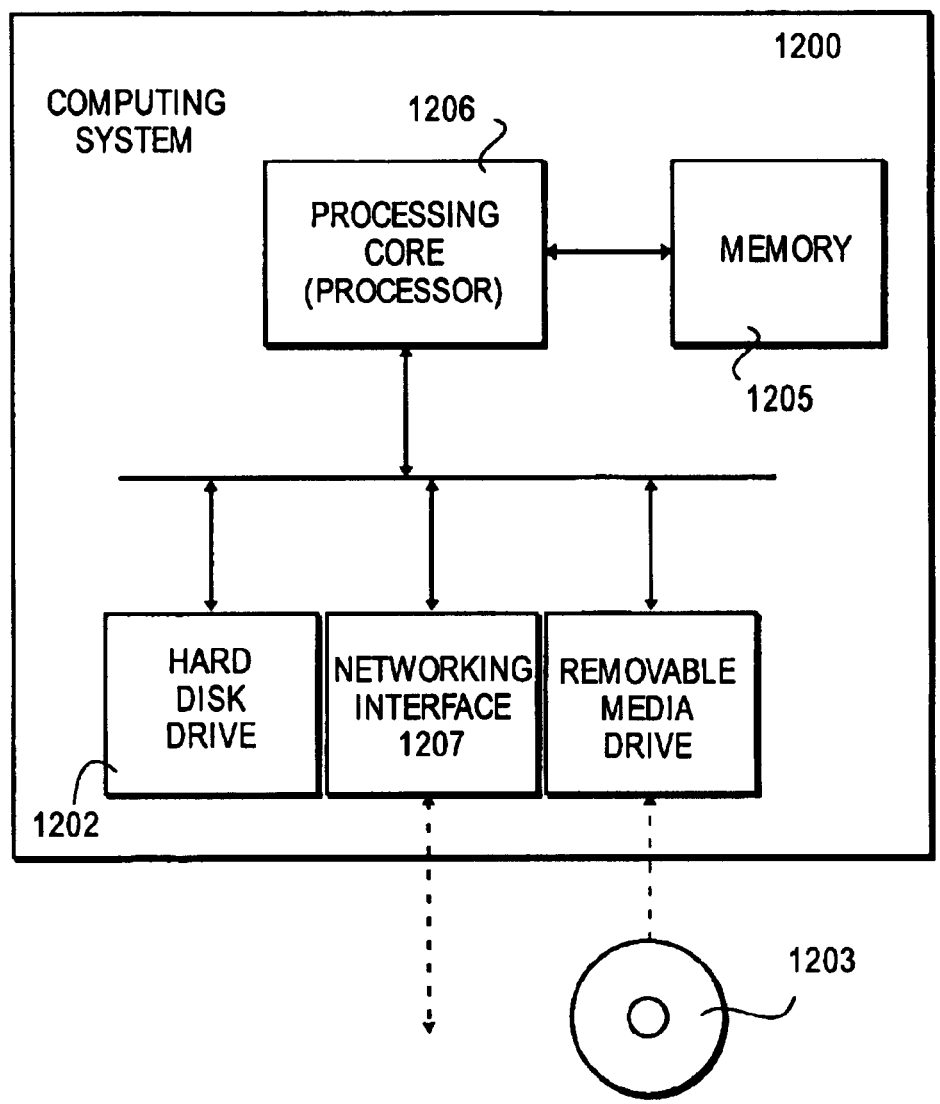
FIG. 12 shows an embodiment of a computing system

FIG. 12 shows an embodiment of a computing system 1200 that can execute instructions residing on a machine readable medium (noting that other (e.g., more elaborate) computing system embodiments are possible). The instructions may be related to integrated circuit design (e.g., as described in FIGS. 2a through 12). In one embodiment, the machine readable medium may be a fixed medium such as a hard disk drive 1202. In other embodiments, the machine readable medium may be movable such as a CD ROM 1203, a compact disc, a magnetic tape, etc. The instructions (or portions thereof) that are stored on the machine readable medium are loaded into memory (e.g., a Random Access Memory (RAM)) 1205; and, the processing core 1206 (e.g., a central processing unit comprising one or more processors) then executes the instructions. The instructions may also be received through a network interface 1207 prior to their being loaded into memory 1205.

Thus, it is also to be understood that embodiments of this invention may be used as or to support a software program executed upon some form of processing core (such as the Central Processing Unit (CPU) of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method, comprising:
   recognizing that a variable within a monomial or posynomial expression for a characteristic of an analog system has a dependency on a lower level expression; and,
   retrieving from a database said lower level expression and substituting it into said expression in place of said variable so as to describe said system at a greater level of detail than said variable did, said lower level expression also being monomial or posynomial.

2. The method of claim 1 wherein each of said expressions are expressed as a logarithm of a posynomial or monomial expression whose variables are expressed as exponentials.

3. The method of claim 2 further comprising solving a convex geometric optimization problem that was created in part by said recognizing and said retrieving.

4. The method of claim 3 further comprising combining the solution of said convex geometric optimization problem with transistor level circuit topography information to form a transistor level netlist.

5. The method of claim 1 wherein said variable describes a characteristic of an integrator and said lower level expression includes a second variable that describes a characteristic of an operational amplifier, said integrator comprised of said operational amplifier.

6. The method of claim 5 wherein said variable is power consumption of said integrator and said second variable is power consumption of said operational amplifier.

7. The method of claim 5 wherein said variable is surface area of said integrator and said second variable is surface area of said operational amplifier.

8. The method of claim 1 wherein said monomial or posynomial expression is for the power consumption of said system and said variable is for the power consumption of a component of said system, and wherein, said lower level expression is for the power consumption of said component and said lower level expression includes a second variable that is for the power consumption of a component of said component of said system.

9. The method of claim 1 wherein said monomial or posynomial expression is for the surface area of said system and said variable is for the surface area of a component of said system, and wherein, said lower level expression is for the surface area of said component and said lower level expression includes a second variable that is for the surface area of a component of said component of said system.

10. The method of claim 1 further comprising:
    substituting circuit topology information for a system level component into a system level circuit topology description of said system to form at least part of an expanded circuit topology description, said circuit topology information describing nodes and components that said system level component is comprised of; and,
    substituting more detailed circuit topology information for each one of said components into said expanded circuit topology description, said more detailed circuit topology information describing nodes and transistors that each one of said components are comprised of.

11. A method, comprising:
    creating a transistor level netlist for an analog system from information produced by a geometric optimization problem solution, said geometric optimization problem established by drilling down through characteristics of said system from a system level to a transistor level, said system level characteristics of said system expressed as a family of equations further comprising posynomial expressions and monomial expressions, said drilling down further comprising:
    substituting a first variable within said family of equations with a first lower level expression, said first lower level expression being posynomial or monomial, said first lower level expression having a second variable that describes a characteristic of said system at a basic building block level of detail; and,
    substituting said second variable with a second lower level expression, said second lower level expression being posynomial or monomial, said second lower level expression having a third variable that describes a characteristic of said system at a transistor level of detail.

12. The method of claim 11 wherein said substituting a first variable is preceded by recognizing that said first variable has a dependency on said first lower level expression.

13. The method of claim 12 further comprising fetching said first level expression from a database after said recognizing but prior to said substituting a first variable.

14. The method of claim 12 wherein said substituting a second variable is preceded by recognizing that said second variable has a dependency on said second lower level expression.

15. The method of claim 4 further comprising fetching said first level expression from a database after said recognizing but prior to said substituting a first variable.

16. The method of claim 11 wherein said substituting a second variable is preceded by recognizing that said second variable has a dependency on said second lower level expression.

17. The method of claim 11 wherein said being posynomial or monomial further comprises being expressed as a logarithm of a posynomial or monomial expression whose variables are expressed as exponentials, and wherein, said geometric optimization problem is expressed in convex form.

18. The method of claim 11 wherein said first variable describes a characteristic of an integrator and said second variable describes a characteristic of a operational amplifier, said integrator comprised of said operational amplifier.

19. The method of claim 18 wherein said first variable is power consumption of said integrator and said second variable is power consumption of said operational amplifier.

20. The method of claim 19 wherein said first variable is surface area of said integrator and said second variable is surface area of said operational amplifier.

21. The method of claim 11 wherein said first expression is for the power consumption of said system and said first variable is for the power consumption of a component of said system, and wherein, said second expression is for the power consumption of said component and said second variable is for the power consumption of a component of said component of said system.

22. The method of claim 11 wherein said first expression is for the surface area of said system and said first variable is for the surface area of a component of said system, and wherein, said second expression is for the surface area of said component and said second variable is for the surface area of a component of said component of said system.

23. The method of claim 11 further comprising creating said transistor level netlist with information produced by:
   substituting circuit topology information for a system level component into a system level circuit topology description of said system to form at least part of an expanded circuit topology description, said circuit topology information describing nodes and basic building blocks that said system level component is comprised of; and,
   substituting more detailed circuit topology information for each one of said basic blocks into said expanded circuit topology description, said more detailed circuit topology information describing nodes and transistors that each one of said basic building blocks are comprised of.

24. The method of claim 11 further comprising creating said family of equations by:
   a) constructing or retrieving a system level circuit topology description of said system in light of system level definition information, and,
   b) constructing or retrieving generic system level behavioral expressions for said system in light of said system level definitional information, where, each of said generic system level behavioral expressions is monomial or posynomial; and,
   c) combining system level numeric constraints with said generic system level behavioral expressions to form said family of equations.

25. A machine readable medium having stored thereon instructions that, when executed by a processing core, cause said processing core to perform a method, said method comprising:
   creating a transistor level netlist for an analog system from information produced by a geometric optimization problem solution, said geometric optimization problem established by drilling down through characteristics of said system from a system level to a transistor level, said system level characteristics of said system expressed as a family of equations comprising posynomial expressions and monomial expressions, said drilling down further comprising:
   substituting a first variable within said family of equations with a first lower level expression, said first lower level expression being posynomial or monomial, said first lower level expression having a second variable that describes a characteristic of said system at a basic building block level of detail; and,
   substituting said second variable with a second lower level expression, said second lower level expression being posynomial or monomial, said second lower level expression having a third variable that describes a characteristic of said system at a transistor level of detail.

26. The machine readable medium of claim 25 wherein said substituting a first variable is preceded by recognizing that said first variable has a dependency on said first lower level expression.

27. The machine readable medium of claim 26 wherein said method further comprises fetching said first level expression from a database after said recognizing but prior to said substituting a first variable.

28. The machine readable medium of claim 26 wherein said substituting a second variable is preceded by recognizing that said second variable has a dependency on said second lower level expression.

29. The machine readable medium of claim 28 wherein said method further comprises fetching said first level expression from a database after said recognizing but prior to said substituting a first variable.

30. The machine readable medium of claim 25 wherein said substituting a second variable is preceded by recognizing that said second variable has a dependency on said second lower level expression.

31. The machine readable medium of claim 25 wherein said being posynomial or monomial further comprises being expressed as a logarithm of a posynomial or monomial expression whose variables are expressed as exponentials, and wherein, said geometric optimization problem is expressed in convex form.

32. The machine readable medium of claim 25 wherein said first variable describes a characteristic of an integrator and said second variable describes a characteristic of a operational amplifier, said integrator comprised of said operational amplifier.

33. The machine readable medium of claim 32 wherein said first variable is power consumption of said integrator and said second variable is power consumption of said operational amplifier.

34. The machine readable medium of claim 33 wherein said first variable is surface area of said integrator and said second variable is surface area of said operational amplifier.

35. The machine readable medium of claim 25 wherein said first expression is for the power consumption of said system and said first variable is for the power consumption of a component of said system, and wherein, said second expression is for the power consumption of said component and said second variable is for the power consumption of a component of said component of said system.

36. The machine readable medium of claim 25 wherein said first expression is for the surface area of said system and said first variable is for the surface area of a component of said system, and wherein, said second expression is for the surface area of said component and said second variable is for the surface area of a component of said component of said system.

37. The machine readable medium of claim 25 wherein said method further comprises creating said transistor level netlist with information produced by:
   substituting circuit topology information for a system level component into a system level circuit topology description of said system to form at least part of an expanded circuit topology description, said circuit topology information describing nodes and basic building blocks that said system level component is comprised of; and, substituting more detailed circuit topology information for each one of said basic blocks into said expanded circuit topology description, said more detailed circuit topology information describing nodes and transistors that each one of said basic building blocks are comprised of.

38. The machine readable medium of claim 25 wherein said method further comprises creating said family of equations by:

a) constructing or retrieving a system level circuit topology description of said system in light of system level definition information, and, constructing or retrieving generic system level behavioral expressions for said system in light of said system level definitional information, where, each of said generic system level behavioral expressions is monomial or posynomial; and, b) combining system level numeric constraints with said generic system level behavioral expressions to form said family of equations.

39. A computing system having a processing core of one or more processors, said computing system configured to execute design tool software, said design tool software comprising executable instructions embedded upon a machine readable medium, said design tool software to execute a method, said method comprising:

creating a transistor level netlist for an analog system from information produced by a geometric optimization problem solution, said geometric optimization problem established by drilling down through characteristics of said system from a system level to a transistor level, said system level characteristics of said system expressed as a family of equations comprising posynomial expressions and OF monomial expressions, said drilling down further comprising:

substituting a first variable within said family of equations with a first lower level expression, said first lower level expression being posynomial or monomial, said first lower level expression having a second variable that describes a characteristic of said system at a basic building block level of detail; and, substituting said second variable with a second lower level expression, said second lower level expression being posynomial or monomial, said second lower level expression having a third variable that describes a characteristic of said system at a transistor level of detail.

40. A machine readable medium having stored thereon instructions that, when executed by a processing core, cause said processing core to perform a method, said method comprising:

recognizing that a variable within a monomial or posynomial expression for a characteristic of an analog system has a dependency on a lower level expression; and, retrieving from a database said lower level expression and substituting it into said expression in place of said variable so as to describe said system at a greater level of detail than said variable did, said lower level expression also being monomial or posynomial.

41. The machine readable medium of claim 40 wherein each of said expressions are expressed as a logarithm of a posynomial or monomial expression whose variables are expressed as exponentials.

42. The machine readable medium of claim 41 wherein said method further comprises solving a convex geometric optimization problem that was created in part by said recognizing and said retrieving.

43. The machine readable medium of claim 42 wherein said method further comprises combining the solution of said convex geometric optimization problem with transistor level circuit topography information to form a transistor level netlist.

44. The machine readable medium of claim 40 wherein said variable describes a characteristic of an integrator and said lower level expression includes a second variable that describes a characteristic of an operational amplifier, said integrator comprised of said operational amplifier.

45. The machine readable medium of claim 44 wherein said variable is power consumption of said integrator and said second variable is power consumption of said operational amplifier.

46. The machine readable medium of claim 44 wherein said variable is surface area of said integrator and said second variable is surface area of said operational amplifier.

47. The machine readable medium of claim 40 wherein said monomial or posynomial expression is for the power consumption of said system and said variable is for the power consumption of a component of said system, and wherein, said lower level expression is for the power consumption of said component and said lower level expression includes a second variable that is for the power consumption of a component of said component of said system.

48. The machine readable medium of claim 40 wherein said monomial or posynomial expression is for the surface area of said system and said variable is for the surface area of a component of said system, and wherein, said lower level expression is for the surface area of said component and said lower level expression includes a second variable that is for the surface area of a component of said component of said system.

49. The machine readable medium of claim 40 wherein said method further comprises:

substituting circuit topology information for a system level component into a system level circuit topology description of said system to form at least part of an expanded circuit topology description, said circuit topology information describing nodes and components that said system level component is comprised of; and, substituting more detailed circuit topology information for each one of said components into said expanded circuit topology description, said more detailed circuit topology information describing nodes and transistors that each one of said components are comprised of.

50. A machine readable medium having stored thereon instructions that, when executed by a processing core, cause said processing core to perform a method, said method comprising:

recognizing that a variable within a monomial or posynomial expression for a characteristic of a mixed signal system has a dependency on a lower level expression; and, retrieving from a database said lower level expression and substituting it into said expression in place of said variable so as to describe said system at a greater level of detail than said variable did, said lower level expression also being monomial or posynomial.

51. The machine readable medium of claim 50 wherein each of said expressions are expressed as a logarithm of a posynomial or monomial expression whose variables are expressed as exponentials.

52. The machine readable medium of claim 51 wherein said method further comprises solving a convex geometric optimization problem that was created in part by said recognizing and said retrieving.

53. The machine readable medium of claim 52 wherein said method further comprises combining the solution of said convex geometric optimization problem with transistor level circuit topography information to form a transistor level netlist.

54. The machine readable medium of claim 50 wherein said variable describes a characteristic of an integrator and said lower level expression includes a second variable that describes a characteristic of an operational amplifier, said integrator comprised of said operational amplifier.

55. The machine readable medium of claim 54 wherein said variable is power consumption of said integrator and said second variable is power consumption of said operational amplifier.

56. The machine readable medium of claim 54 wherein said variable is surface area of said integrator and said second variable is surface area of said operational amplifier.

57. The machine readable medium of claim 50 wherein said monomial or posynomial expression is for the power consumption of said system and said variable is for the power consumption of a component of said system, and wherein, said lower level expression is for the power consumption of said component and said lower level expression includes a second variable that is for the power consumption of a component of said component of said system.

58. The machine readable medium of claim 50 wherein said monomial or posynomial expression is for the surface area of said system and said variable is for the surface area of a component of said system, and wherein, said lower level expression is for the surface area of said component and said lower level expression includes a second variable that is for the surface area of a component of said component of said system.

59. The machine readable medium of claim 50 further comprising:
    substituting circuit topology information for a system level component into a system level circuit topology description of said system to form at least part of an expanded circuit topology description, said circuit topology information describing nodes and components that said system level component is comprised of; and,
    substituting more detailed circuit topology information for each one of said components into said expanded circuit topology description, said more detailed circuit topology information describing nodes and transistors that each one of said components are comprised of.

60. A method, comprising:
    creating a transistor level netlist for a mixed signal system from information produced by a geometric optimization problem solution, said geometric optimization problem established by drilling down through characteristics of said system from a system level to a transistor level, said system level characteristics of said system expressed as a family of equations comprising posynomial expressions and monomial expressions, said drilling down further comprising:
    substituting a first variable within said family of equations with a first lower level expression, said first lower level expression being posynomial or monomial, said first lower level expression having a second variable that describes a characteristic of said system at a basic building block level of detail; and,
    substituting said second variable with a second lower level expression, said second lower level expression being posynomial or monomial, said second lower level expression having a third variable that describes a characteristic of said system at a transistor level of detail.

61. The method of claim 60 wherein said substituting a first variable is preceded by recognizing that said first variable has a dependency on said first lower level expression.

62. The method of claim 61 further comprising fetching said first level expression from a database after said recognizing but prior to said substituting a first variable.

63. The method of claim 61 wherein said substituting a second variable is preceded by recognizing that said second variable has a dependency on said second lower level expression.

64. The method of claim 63 further comprising fetching said first level expression from a database after said recognizing but prior to said substituting a first variable.

65. The method of claim 60 wherein said substituting a second variable is preceded by recognizing that said second variable has a dependency on said second lower level expression.

66. The method of claim 60 wherein said being posynomial or monomial further comprises being expressed as a logarithm of a posynomial or monomial expression whose variables are expressed as exponentials, and wherein, said geometric optimization problem is expressed in convex form.

67. The method of claim 60 wherein said first variable describes a characteristic of an integrator and said second variable describes a characteristic of a operational amplifier, said integrator comprised of said operational amplifier.

68. The method of claim 67 wherein said first variable is power consumption of said integrator and said second variable is power consumption of said operational amplifier.

69. The method of claim 68 wherein said first variable is surface area of said integrator and said second variable is surface area of said operational amplifier.

70. The method of claim 60 wherein said first expression is for the power consumption of said system and said first variable is for the power consumption of a component of said system, and wherein, said second expression is for the power consumption of said component and said second variable is for the power consumption of a component of said component of said system.

71. The method of claim 60 wherein said first expression is for the surface area of said system and said first variable is for the surface area of a component of said system, and wherein, said second expression is for the surface area of said component and said second variable is for the surface area of a component of said component of said system.

72. The method of claim 60 further comprising creating said transistor level netlist with information produced by:
    substituting circuit topology information for a system level component into a system level circuit topology description of said system to form at least part of an expanded circuit topology description, said circuit topology information describing nodes and basic building blocks that said system level component is comprised of; and,
    substituting more detailed circuit topology information for each one of said basic blocks into said expanded circuit topology description, said more detailed circuit topology information describing nodes and transistors that each one of said basic building blocks are comprised of.

73. The method of claim 60 further comprising creating said family of equations by:
   a) constructing or retrieving a system level circuit topology description of said system in light of system level definition information, and,
   b) constructing or retrieving generic system level behavioral expressions for said system in light of said system level definitional information, where, each of said generic system level behavioral expressions is monomial or posynomial; and,
   c) combining system level numeric constraints with said generic system level behavioral expressions to form said family of equations.

74. A machine readable medium having stored thereon instructions that, when executed by a processing core, cause said processing core to perform a method, said method comprising:
   creating a transistor level netlist for a mixed signal system from information produced by a geometric optimization problem solution, said geometric optimization problem established by drilling down through characteristics of said system from a system level to a transistor level, said system level characteristics of said system expressed as a family of equations comprising posynomial expressions and monomial expressions, said drilling down further comprising:
   substituting a first variable within said family of equations with a first lower level expression, said first lower level expression being posynomial or monomial, said first lower level expression having a second variable that describes a characteristic of said system at a basic building block level of detail; and,
   substituting said second variable with a second lower level expression, said second lower level expression being posynomial or monomial, said second lower level expression having a third variable that describes a characteristic of said system at a transistor level of detail.

75. The machine readable medium of claim 74 wherein said substituting a first variable is preceded by recognizing that said first variable has a dependency on said first lower level expression.

76. The machine readable medium of claim 75 wherein said method further comprises fetching said first level expression from a database after said recognizing but prior to said substituting a first variable.

77. The machine readable medium of claim 75 wherein said substituting a second variable is preceded by recognizing that said second variable has a dependency on said second lower level expression.

78. The machine readable medium of claim 77 wherein said method further comprises fetching said first level expression from a database after said recognizing but prior to said substituting a first variable.

79. The machine readable medium of claim 74 wherein said substituting a second variable is preceded by recognizing that said second variable has a dependency on said second lower level expression.

80. The machine readable medium of claim 74 wherein said being posynomial or monomial further comprises being expressed as a logarithm of a posynomial or monomial expression whose variables are expressed as exponentials, and wherein, said geometric optimization problem is expressed in convex form.

81. The machine readable medium of claim 74 wherein said first variable describes a characteristic of an integrator and said second variable describes a characteristic of a operational amplifier, said integrator comprised of said operational amplifier.

82. The machine readable medium of claim 81 wherein said first variable is power consumption of said integrator and said second variable is power consumption of said operational amplifier.

83. The machine readable medium of claim 82 wherein said first variable is surface area of said integrator and said second variable is surface area of said operational amplifier.

84. The machine readable medium of claim 74 wherein said first expression is for the power consumption of said system and said first variable is for the power consumption of a component of said system, and wherein, said second expression is for the power consumption of said component and said second variable is for the power consumption of a component of said component of said system.

85. The machine readable medium of claim 74 wherein said first expression is for the surface area of said system and said first variable is for the surface area of a component of said system, and wherein, said second expression is for the surface area of said component and said second variable is for the surface area of a component of said component of said system.

86. The machine readable medium of claim 74 wherein said method further comprises creating said transistor level netlist with information produced by:
   substituting circuit topology information for a system level component into a system level circuit topology description of said system to form at least part of an expanded circuit topology description, said circuit topology information describing nodes and basic building blocks that said system level component is comprised of; and,
   substituting more detailed circuit topology information for each one of said basic blocks into said expanded circuit topology description, said more detailed circuit topology information describing nodes and transistors that each one of said basic building blocks are comprised of.

87. The machine readable medium of claim 74 wherein said method further comprises creating said family of equations by:
   a) constructing or retrieving a system level circuit topology description of said system in light of system level definition information, and, constructing or retrieving generic system level behavioral expressions for said system in light of said system level definitional information, where, each of said generic system level behavioral expressions is monomial or posynomial; and,
   b) combining system level numeric constraints with said generic system level behavioral expressions to form said family of equations.

88. A computing system having a processing core of one or more processors, said computing system configured to execute design tool software, said design tool software comprising executable instructions embedded upon a machine readable medium, said design tool software to execute a method, said method comprising:
   creating a transistor level netlist for a mixed signal system from information produced by a geometric optimization problem solution, said geometric optimization problem established by drilling down through characteristics of said system from a system level to a transistor level, said system level characteristics of said system expressed as a family of equations, each equation within said family of equations being posynomial or monomial, said drilling down further comprising:

substituting a first variable within said family of equations with a first lower level expression, said first lower level expression being posynomial or monomial, said first lower level expression having a second variable that describes a characteristic of said system at a basic building block level of detail; and, substituting said second variable with a second lower level expression, said second lower level expression being posynomial or monomial, said second lower level expression having a third variable that describes a characteristic of said system at a transistor level of detail.

89. A method comprising:

recognizing that a variable within a monomial or posynomial expression for a characteristic of a mixed signal system has a dependency on a lower level expression; and, retrieving from a database said lower level expression and substituting it into said expression in place of said variable so as to describe said system at a greater level of detail than said variable did, said lower level expression also being monomial or posynomial.

* * * * *